(12) United States Patent
Kim et al.

(10) Patent No.: US 8,279,616 B2
(45) Date of Patent: Oct. 2, 2012

(54) PRINTED CIRCUIT BOARD WITH EMBEDDED CHIP CAPACITOR

(75) Inventors: Han Kim, Yongin-si (KR); Je-Gwang Yoo, Yongin-si (KR); Mi-Ja Han, Jeonju-si (KR); Dae-Hyun Park, Ulsan (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/064,541

(22) Filed: Mar. 30, 2011

(65) Prior Publication Data

US 2011/0180312 A1    Jul. 28, 2011

Related U.S. Application Data

(62) Division of application No. 12/007,793, filed on Jan. 15, 2008, now abandoned.

(30) Foreign Application Priority Data

Sep. 28, 2007 (KR) .................. 10-2007-0097722

(51) Int. Cl.
*H05K 1/18* (2006.01)

(52) U.S. Cl. ........ 361/763; 174/261; 361/761; 361/766; 361/780

(58) Field of Classification Search .................. 361/734, 361/748, 760, 761, 763, 766, 767, 780, 782, 361/800; 174/250, 260, 261
See application file for complete search history.

(56) References Cited

U.S. PATENT DOCUMENTS

| | | | |
|---|---|---|---|
| 5,889,314 | A | 3/1999 | Hirabayashi |
| 6,407,929 | B1 | 6/2002 | Hale et al. |
| 6,614,325 | B1 | 9/2003 | Kocin |
| 6,800,920 | B2 | 10/2004 | Nishijima |
| 7,198,986 | B2 | 4/2007 | Sunohara |
| 7,447,038 | B2 | 11/2008 | Uematsu et al. |
| 7,459,761 | B2 | 12/2008 | Lin |
| 2002/0132094 | A1 | 9/2002 | Takeuchi et al. |
| 2002/0185303 | A1* | 12/2002 | Takeuchi et al. .............. 174/256 |
| 2003/0168716 | A1 | 9/2003 | Lee et al. |
| 2004/0160751 | A1* | 8/2004 | Inagaki et al. ................ 361/763 |
| 2004/0165361 | A1 | 8/2004 | Kimura et al. |
| 2005/0205292 | A1 | 9/2005 | Rogers et al. |
| 2007/0253144 | A1 | 11/2007 | Kuwajima |

FOREIGN PATENT DOCUMENTS

| | | |
|---|---|---|
| JP | 7-66530 | 3/1995 |
| JP | 11-54927 | 2/1999 |
| JP | 2002-208780 | 7/2002 |

(Continued)

OTHER PUBLICATIONS

U.S. Appl. No. 12/007,793, filed Jan. 15, 2008, Han Kim et al., Samsung Electro-Mechanics Co., Ltd.

(Continued)

*Primary Examiner* — Hoa C Nguyen

(57) ABSTRACT

A printed circuit board having an embedded chip capacitor includes a first conductive layer; a second conductive layer, placed away from the first conductive layer; a chip capacitor, having a first electrode connected to the first conductive layer through being seated in a cavity formed between the first conductive layer and the second conductive layer; a filled material, filled in a space excluding a space occupied by the chip capacitor in the cavity; and a via, penetrating the filled material and connecting the second conductive layer to the second electrode of the chip capacitor.

9 Claims, 29 Drawing Sheets

FOREIGN PATENT DOCUMENTS

| | | |
|---|---|---|
| JP | 2006-253168 | 9/2006 |
| JP | 2007-214535 | 8/2007 |
| JP | 2007-221093 | 8/2007 |

OTHER PUBLICATIONS

U.S. Appl. No. 13/064,542, filed Mar. 30, 2011, Han Kim et al., Samsung Electro-Mechanics Co., Ltd.
Final Office Action dated Dec. 30, 2010 for related U.S. Appl. No. 12/007,793.
Office Action dated Sep. 14, 2010 for related U.S. Appl. No. 12/007,793.
Japanese Office Action dated May 11, 2010 and issued in corresponding Japanese Patent Application 2008-034473.
Restriction Requirement dated Jul. 19, 2010 for related U.S. Appl. No. 12/007,793.
US Office Action dated Aug. 17, 2012 in copending U.S. Appl. No. 13/064,542.

* cited by examiner

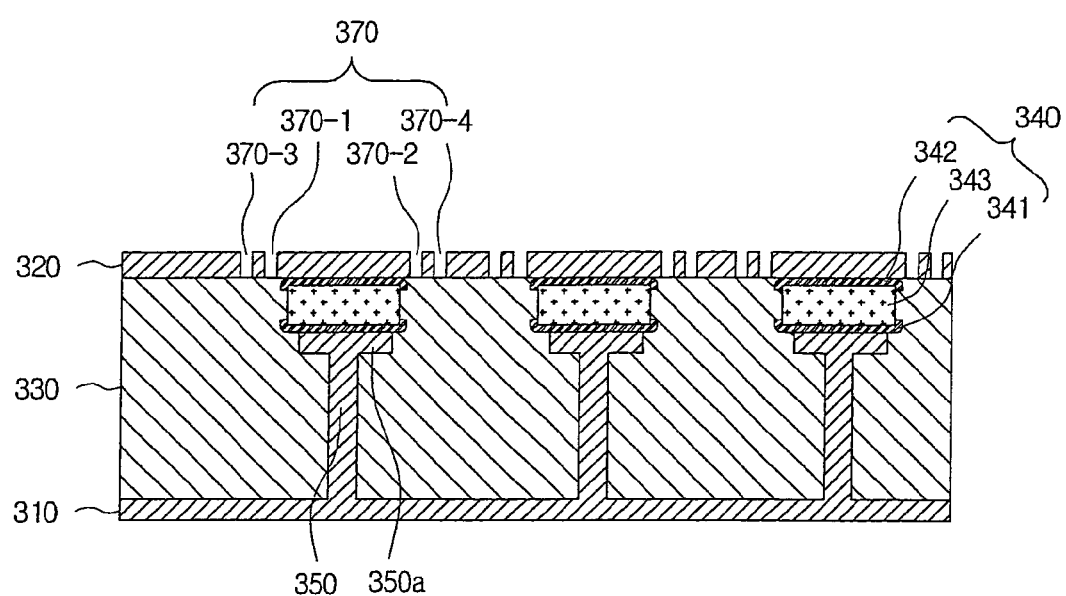

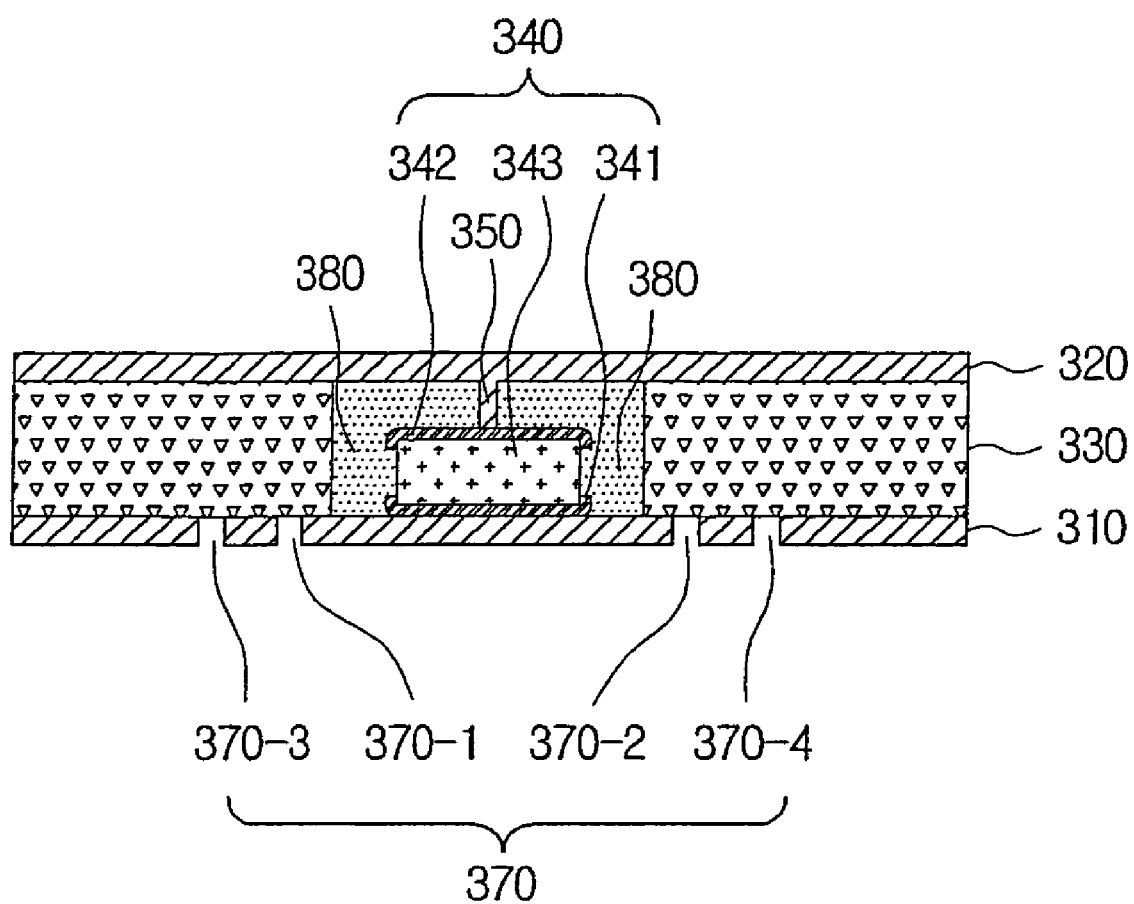

PRINTED CIRCUIT BOARD WITH EMBEDDED CHIP CAPACITOR

CROSS-REFERENCE TO RELATED APPLICATIONS

This application is a U.S. divisional application filed under 37 CFR 1.53(b) claiming priority benefit of U.S. patent application Ser. No. 12/007,793, filed Jan. 15, 2008, now abandoned which claims earlier priority benefit to Korean Patent Application No. 10-2007-0097722, filed with the Korean Intellectual Property Office on Sep. 28, 2007, the disclosures of which are incorporated herein by reference.

BACKGROUND

1. Field

The present invention relates to a printed circuit board, more specifically to a printed circuit board having an embedded chip capacitor and a chip capacitor embedding method that can use a series connection structure between a chip capacitor and a via as an electromagnetic bandgap structure.

2. Description of the Related Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-stacked in printed circuit board is illustrated, various printed circuit boards such as 2 and 6-stacked in printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal having a certain frequency band, transferring the EM wave 150 including the signals having the certain frequency band from the digital circuit 130 may make it difficult to accurately receive the signal having the certain frequency band.

Solving the problem mixed signals becomes more difficult due to the higher operation frequency of the digital circuit 130 according to the increased complexity of electronic apparatuses.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board in which the digital circuit and the RF circuit are realized together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the mixed signal problem simultaneously. In other words, the smaller sized mushroom type structure causes the bandgap frequency band shielding the noise to be increased. Also, the larger sized mushroom type structure needs the increase of the size, thickness and volume of the printed circuit board.

In accordance with the conventional art, the mushroom type structures are required to be repeatedly arranged close to each other in order to be used as the electromagnetic bandgap structure. However, this may have a bad influence on signal integrity. Here, the signal integrity indicates the accuracy of signal transfer such as whether to delay transferring a signal and whether to maintain a signal type as a performance evaluation index related to how stable a signal is transferred in time.

Also, in the case of having the complex line structure in which the digital circuit and the RF circuit are realized on the same board like the main board of a mobile phone or mounting a lot of active elements and passive elements in the same small-sized board as a system in package (SiP) board, a lot of design limitations are required to be recovered to realize the electromagnetic bandgap structure by the conventional mushroom type structure.

SUMMARY

Accordingly, the present invention provides a printed circuit board having an embedded chip capacitor that uses the series connection structure between the chip capacitor and a via as an electromagnetic bandgap structure to solve a problem mixed signals, various electrical parts and elements including an analog circuit and a digital circuit being mounted in the printed circuit board.

The present invention also provides a printed circuit board having an embedded chip capacitor that can simply prevent the noise having a desired frequency band by using the cavity capacitor having a simple structure as an electromagnetic bandgap structure.

In addition, the present invention provides a compact, thin film and light-weighted printed circuit board having an embedded chip capacitor with high capacity and high efficiency through a simple fabrication process and a reduced fabrication time and cost.

An aspect of the present invention features a printed circuit board having an embedded chip capacitor including a first conductive layer; a second conductive layer, placed away from the first conductive layer; a chip capacitor, placed between the first conductive layer and the second conductive layer and having a second electrode, connected to the second conductive layer; and a via, connecting the first conductive layer to a first electrode of the chip capacitor.

Here, a via land can be formed in one end part of the via, and the via can be connected to the first electrode through the via land formed in the one end part of the via, and the other end part of the via can be connected to the first conductive layer.

The chip capacitor can include a first electrode, a dielectric member, placed on the first electrode, and a second electrode, placed on the dielectric member. At this time, the chip capacitor can be seated on the via land.

The chip capacitor can include a dielectric member, a first electrode, which is coupled to a right side of the dielectric member, and a second electrode, which is coupled to a left side of the dielectric member. At this time, a clearance hole can be formed in a part corresponding to a position of the first electrode in the second conductive layer to allow the first electrode to be electrically disconnected to the second conductive layer.

Another aspect of the present invention features a printed circuit board having an embedded chip capacitor including a first conductive layer; a second conductive layer, placed away from the first conductive layer; a chip capacitor, having a first electrode connected to the first conductive layer through being seated in a cavity formed between the first conductive layer and the second conductive layer; a filled material, filled in a space excluding the space occupied by the chip capacitor in the cavity; and a via, penetrating the filled material and connecting the second conductive layer to the second electrode of the chip capacitor.

Here, any one of the first conductive layer and the second conductive layer can be a power layer, and the other end part can be a ground part.

An etched pattern can be formed in an open-curved line shape in a surrounding area of a part corresponding to a position of the via or the chip capacitor in the first conductive layer or the second conductive layer.

The etched pattern can have a spiral shape.

The chip capacitor can be coupled to an inductance component by the via, connected to the chip capacitor in series, to intercept the transfer of an electromagnetic wave having a desired frequency band.

A plurality of series connection structures between the chip capacitor and the via can be arranged in a noise transferable path between a noise source and a noise prevented destination.

The printed circuit board can be mounted with a digital circuit and an analog circuit, and the noise source and the noise prevented destination can correspond to one and the other, respectively, of positions in which the digital circuit and the analog circuit are supposed to be mounted in the printed circuit board.

The series connection structure between the chip capacitor and the via can be arranged in a band structure in the noise transferable path.

The band structure can have a shape enveloping at least one of the noise source and the noise prevented destination. For example, the band structure can have any one of closed loop, rectangular shape with one side open, and 'L' shapes.

The band structure can have a straight-line shape of at least one line to separate the noise source and the noise prevented destination by crossing the area between the noise source and the noise prevented destination.

Another aspect of the present invention features a method of embedding a chip capacitor in a printed circuit board including a first conductive layer and a dielectric layer placed on the first conductive layer, the method including removing the dielectric layer to form a cavity exposing the first conductive layer; seating a chip capacitor in the cavity; filling a filled material at a space excluding the space occupied by the chip capacitor in the cavity; forming a via penetrating the filled material and being connected to the chip capacitor; and stacking a conductive material to constitute a second conductive layer in surfaces of the via and the dielectric layer and in an surface of the filled material filled in the cavity.

Here, chip capacitor can include a first electrode, a dielectric member, placed on the first electrode, and a second electrode, placed on the dielectric member, and the first electrode is connected to the first conductive layer, and the second electrode can be connected to the second conductive layer through the via.

The present invention can further include forming an etched pattern in an open-curved line shape in a surrounding area of a part corresponding to a position in which the cavity is supposed to be formed in the first conductive layer.

The present invention can further include forming an etched pattern in an open-curved line shape in a surrounding area of a part corresponding to a position in which the via is formed in the second conductive layer Here, etched pattern can have a spiral shape.

BRIEF DESCRIPTION OF THE DRAWINGS

These and other features, aspects and advantages of the present invention will become better understood with regard to the following description, appended claims and accompanying drawings where:

FIG. 8A is a side view showing a printed circuit board having an embedded chip capacitor in accordance with a second embodiment of the present invention;

FIG. 12B is a side view showing a printed circuit board having an embedded chip capacitor in accordance with a sixth embodiment of the present invention;

DESCRIPTION OF EMBODIMENTS

Figure 1:
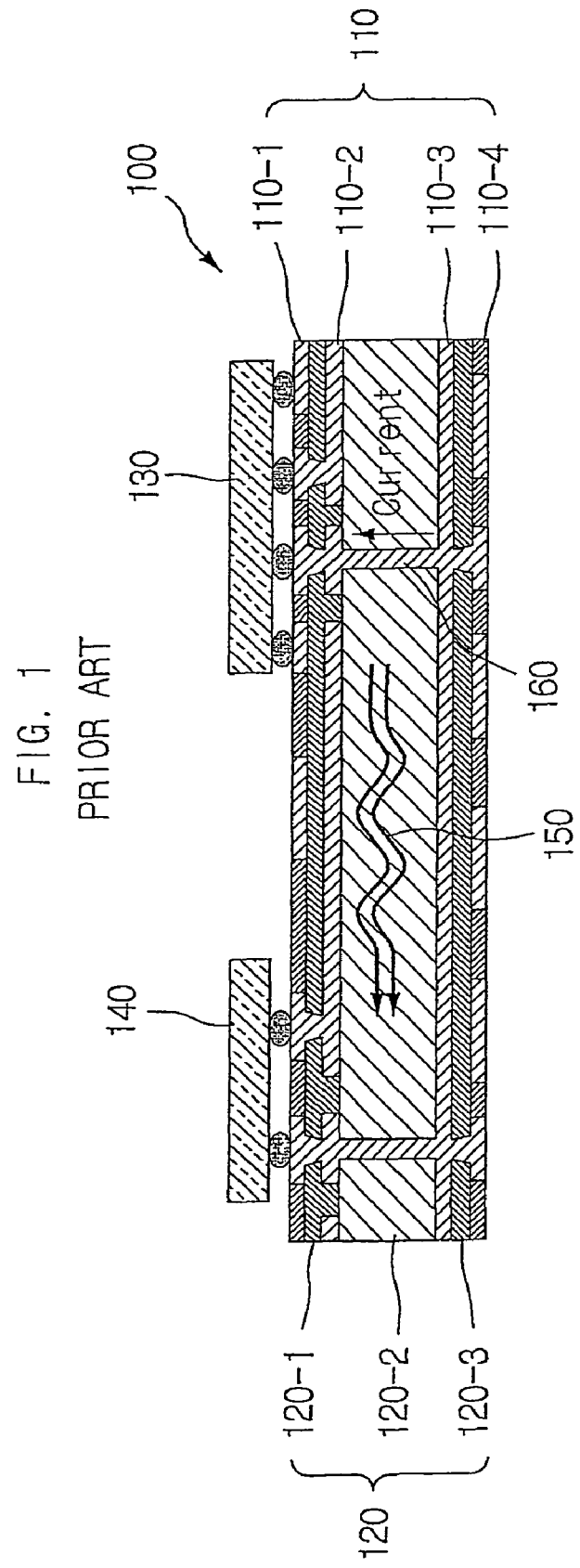
FIG. 1 is a sectional view showing a printed circuit board including analog circuit and a digital circuit.
Figure 2:
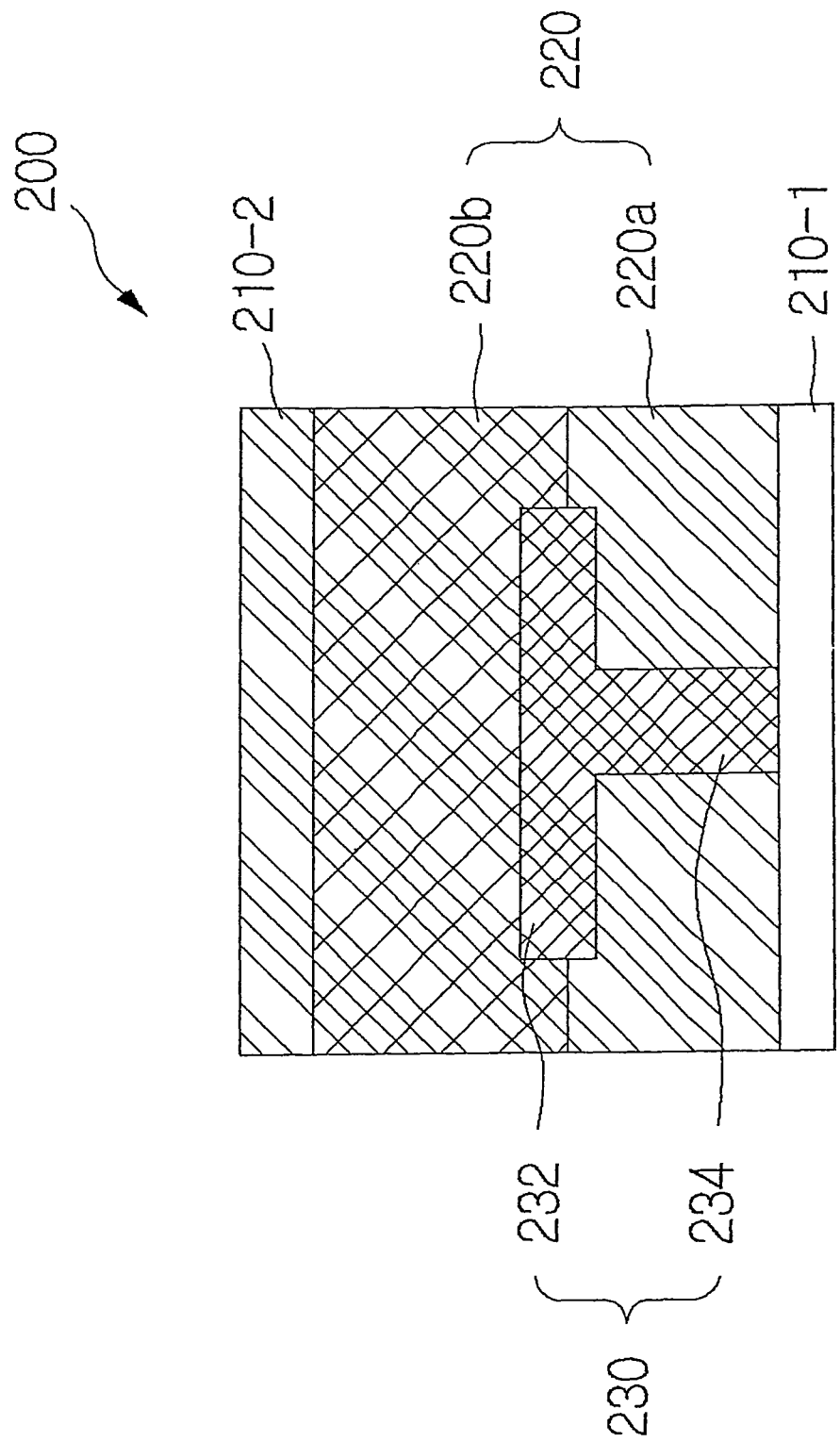
FIG. 2 is a sectional view showing an electromagnetic bandgap structure that solves a problem mixed signals between an analog circuit and a digital circuit in accordance with a conventional art.
Figure 3:
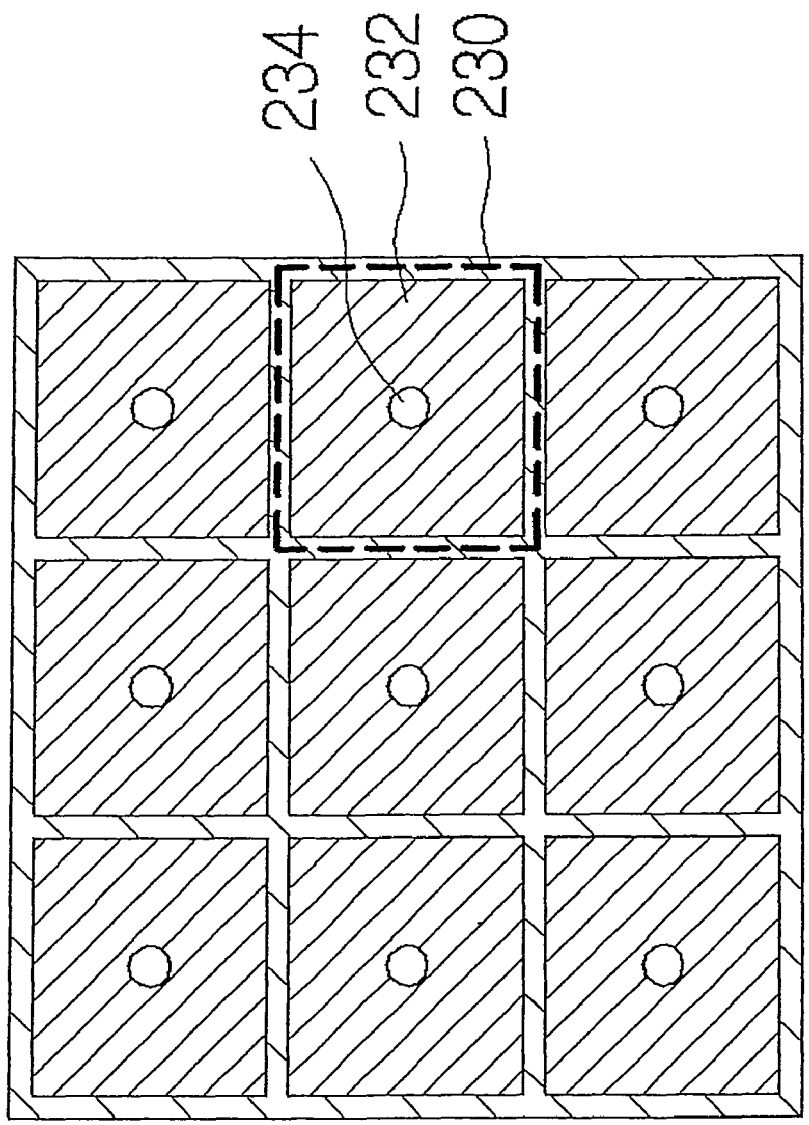
FIG. 3 is a plan view showing a metal plate configuration of the electromagnetic bandgap structure shown in FIG. 2.
Figure 4:
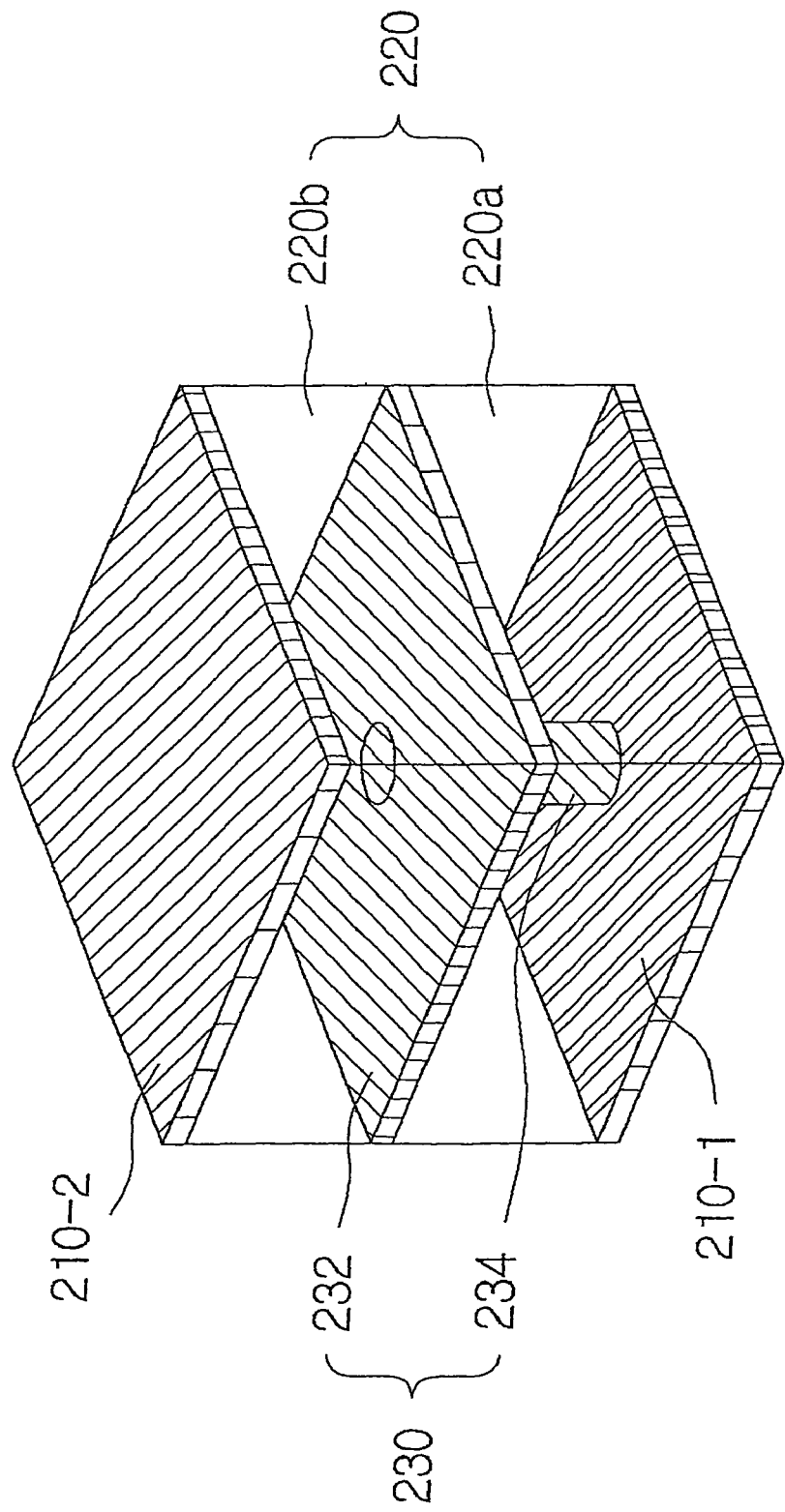
FIG. 4 is a perspective view showing the electromagnetic bandgap structure shown in FIG. 2.
Figure 5:
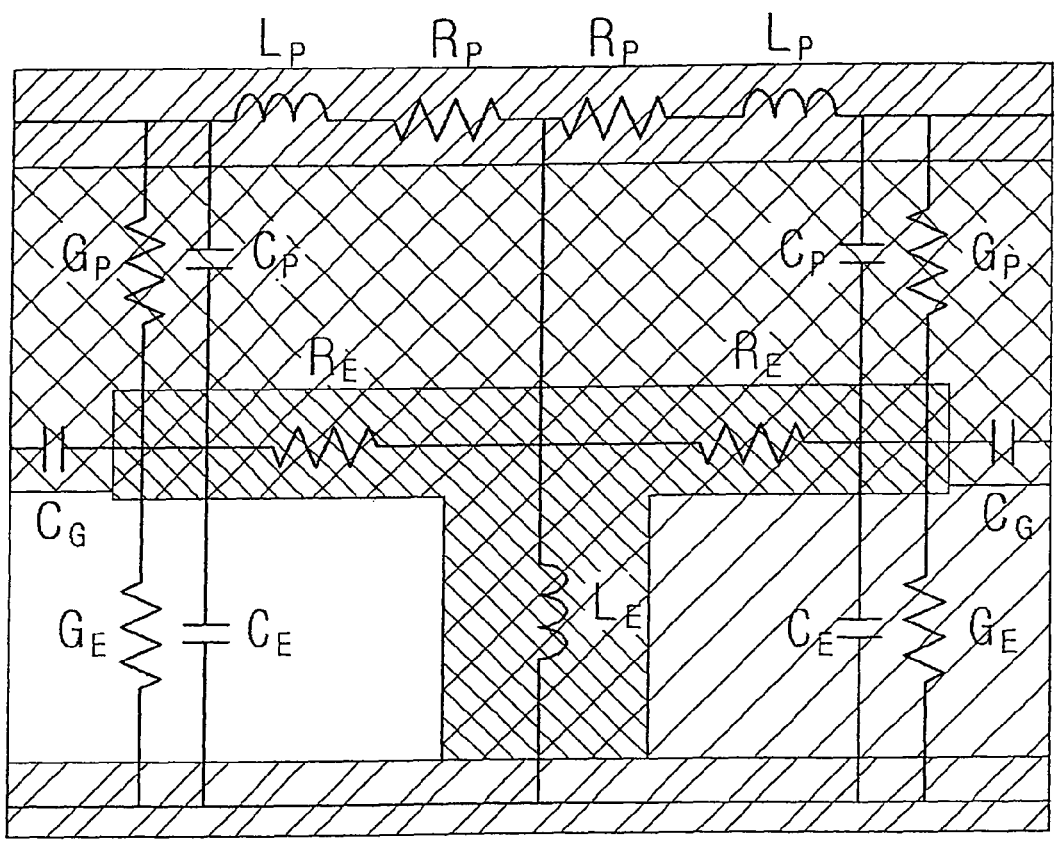
FIG. 5 is a schematic view showing an equivalent circuit of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings. The overlapping description that is identically applicable to each embodiment will be omitted.

Figure 6:
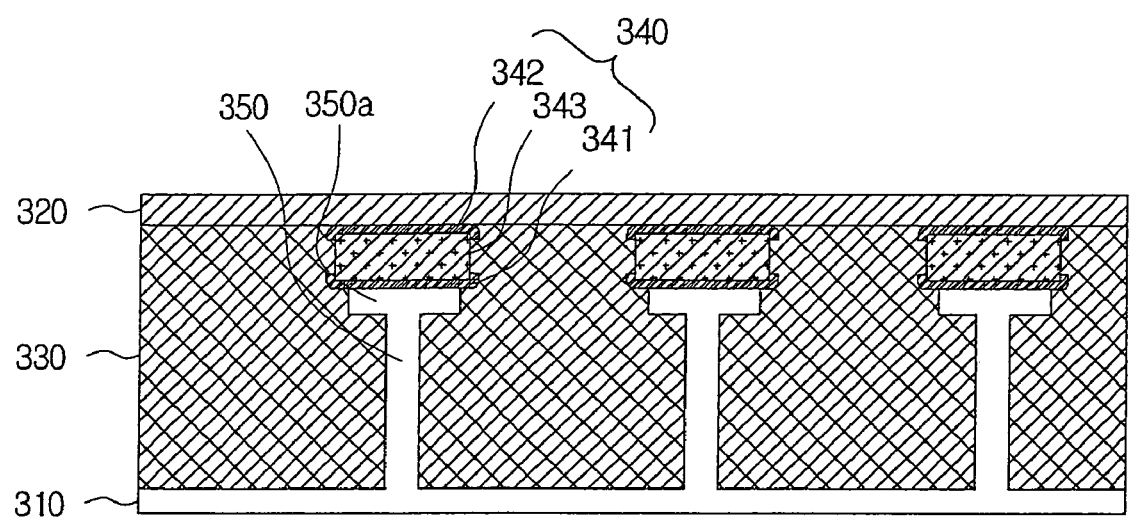
FIG. 6 is a side view showing a printed circuit board having an embedded chip capacitor in accordance with a first embodiment of the present invention.
Figure 7:
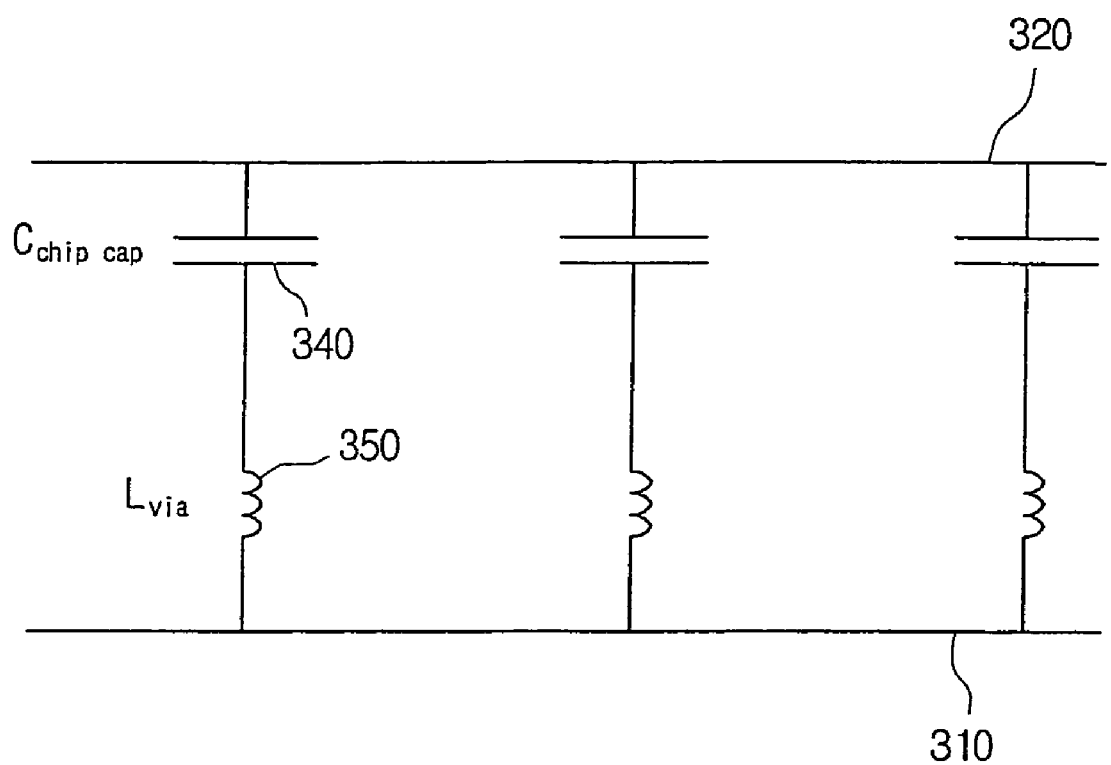
FIG. 7 is a schematic view showing an equivalent circuit of the printed circuit board shown in FIG. 6.

FIG. 6 is a side view showing a printed circuit board having an embedded chip capacitor in accordance with a first embodiment of the present invention, and FIG. 7 is a schematic view showing an equivalent circuit of the printed circuit board shown in FIG. 6.

Referring to FIG. 6, a printed circuit board having an embedded chip capacitor in accordance with a first embodiment of the present invention can include a first conductive layer 310, a second conductive layer 320, a dielectric layer 330, a chip capacitor 340 and a via 350.

Any one of the first conductive 310 and the second conductive layer 320 can be used as a power layer, and the other can be used as a ground layer. Accordingly, the first conductive 310 and the second conductive layer 320 can be away from each other through the dielectric layer 330 placed therebetween in order to allow the first conductive 310 and to be electrically disconnected to the second conductive layer 320.

The chip capacitor 340 can be embedded between the first conductive layer 310 and the second conductive layer 320 in the printed circuit board. The chip capacitor 340 can include a first electrode 341, a dielectric member 343 placed on the first electrode 341 and a second electrode 342 placed on the dielectric member 343. At this time, the second electrode 342 can be electrically connected to the second conductive layer 320 through a surface contact method, and the first electrode 341 can be electrically connected to the first conductive layer

310 through the via 350. For this, a via land 350a can be formed in one end part of the via 350. The via 350 can be connected to the first electrode 341 through the via land 350a formed in the one end part, and the other end part of the via 350 can be connected to the first conductive layer 310. In other words, the via land 350a, which is for recovering a position error, can be formed larger than the sectional area of the via 350. The chip capacitor 340 can be seated on the via land 350a.

FIG. 7 is a schematic view showing an equivalent circuit of the printed circuit board shown in FIG. 6. As shown in the schematic view of FIG. 7, in accordance with the present invention, the chip capacitor 340 and the via 350 formed between the first conductive layer 310 and the second conductive layer 320 can function as a capacitance component and an inductance component, respectively. The chip capacitor 340 and the via 350 can be connected to each other in series. As such, the present invention can function as a band reject filter by using the LC series connection structure between the chip capacitor 340 and the via 350, to thereby intercept the transfer of an electromagnetic wave having a frequency band. In other words, since the present invention functions as the band reject filter through the LC series connection by the chip capacitor 340 and the via 350, which is the 'structural property' of the printed circuit board, the series connection structure between the chip capacitor 340 and the via 350 can be used as the electromagnetic structure.

Accordingly, if the diameter, length and shape of the via 350 are precisely designed and controlled in the present invention, the via 350 can be manufactured to have a desired inductance value. Also, if the chip capacitor 340 having a desired capacitance value is selected considering the thickness and area size of the dielectric member 343 of the chip capacitor 340 and the type and dielectric constant of the dielectric material forming the dielectric member 343 and the selected chip capacitor 340 is applied to the printed circuit board, the present invention can intercept the transfer of an electromagnetic wave having a desired frequency band. This can solve the mixed signal and noise problem of the printed circuit board.

In particular, since it is possible to acquire a high-capacity and high-efficiency capacitance value in accordance with the present invention, the smaller-sized electromagnetic bandgap structure can be realized in a small space as compared with the conventional mushroom type structure. The preventing efficiency can be also improved.

Figure 8B:
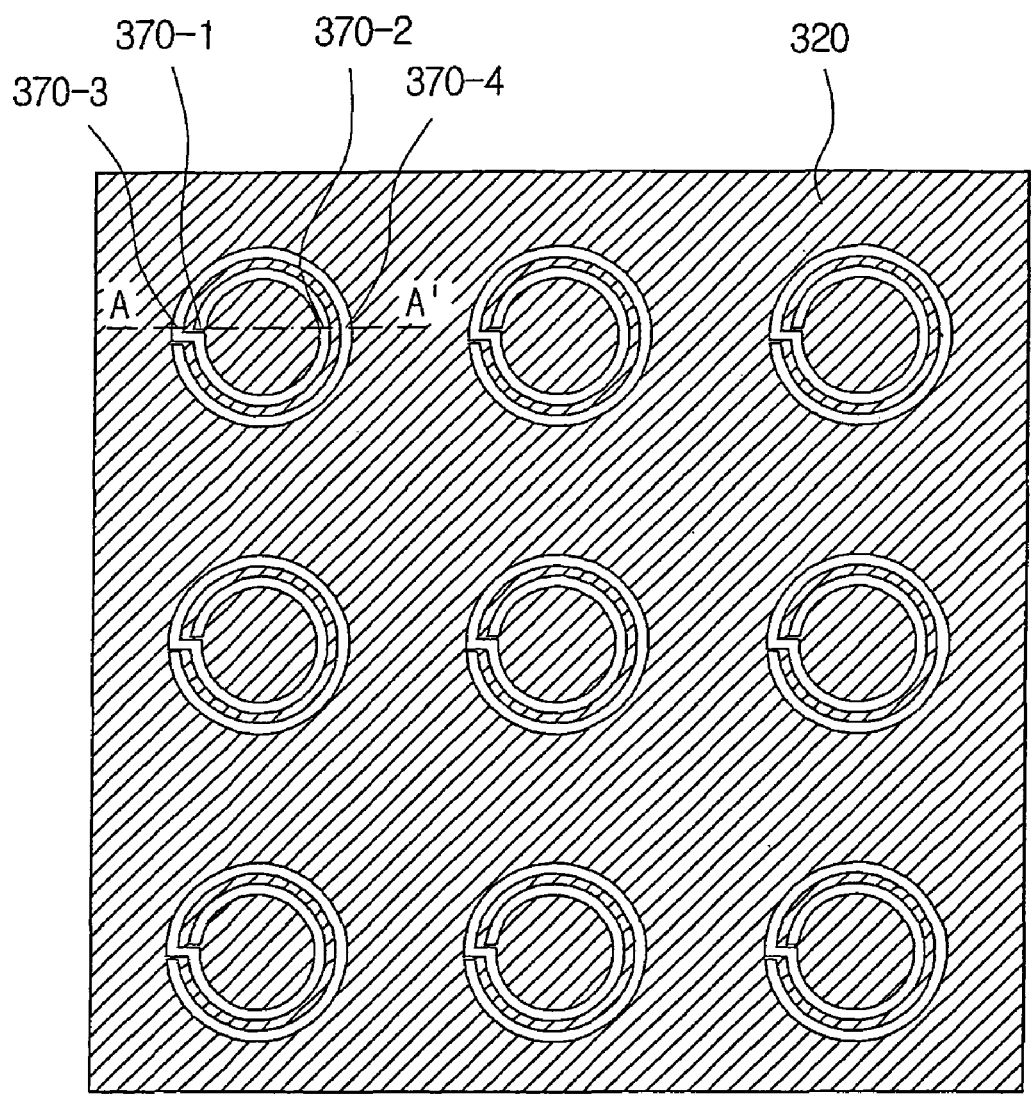
FIG. 8B illustrates the type of an etched pattern when the printed circuit board shown in FIG. 8A is viewed from an upper side.
Figure 8C:
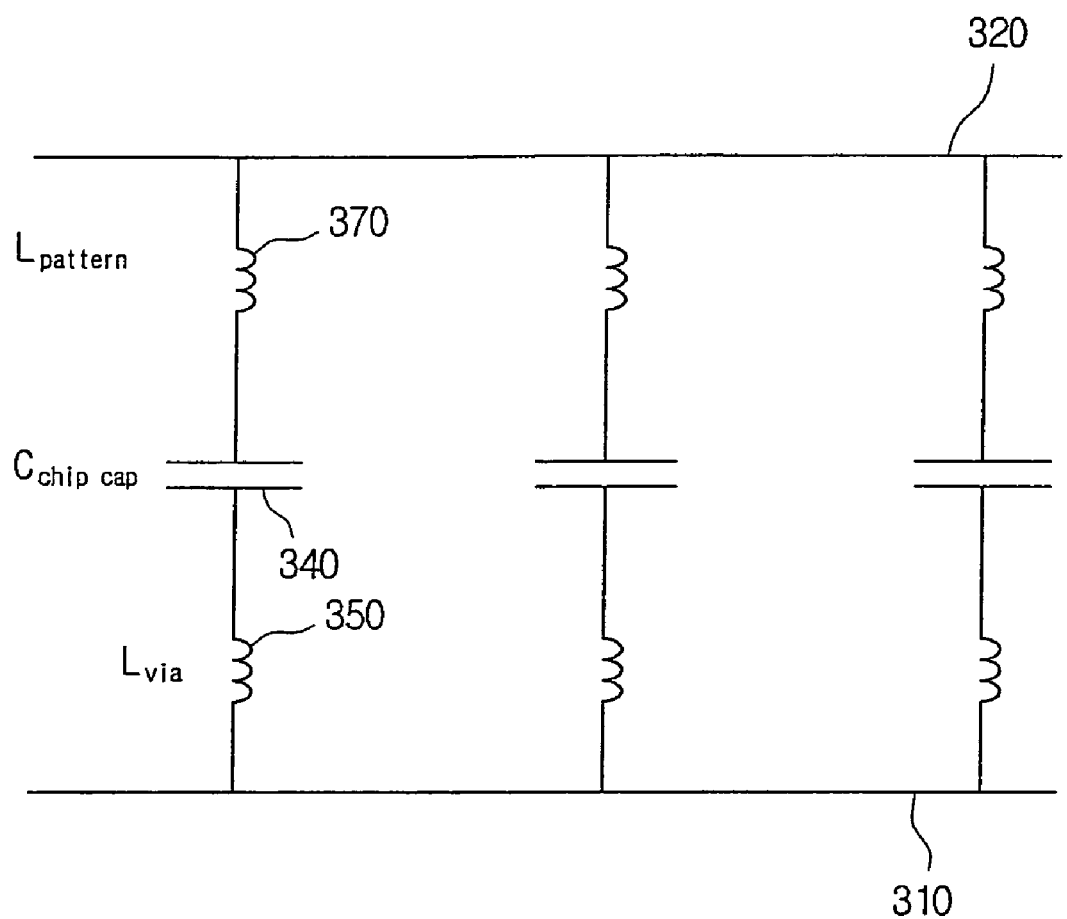
FIG. 8C is a schematic view showing an equivalent circuit of the printed circuit board shown in FIG. 8A.
Figure 9A:
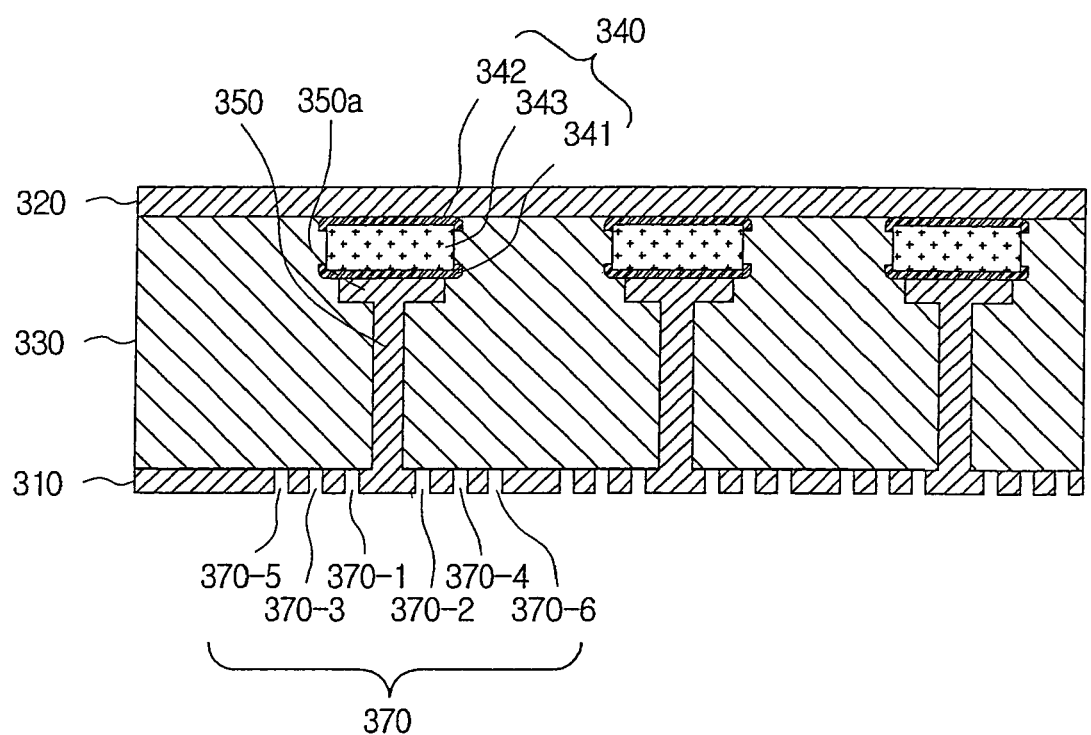
FIG. 9A is a side view showing a printed circuit board having an embedded chip capacitor in accordance with a third embodiment of the present invention.

FIG. 8A is a side view showing a printed circuit board having an embedded chip capacitor in accordance with a second embodiment of the present invention, FIG. 8B illustrates the type of an etched pattern when the printed circuit board shown in FIG. 8A is viewed from an upper side and FIG. 8C is a schematic view showing an equivalent circuit of the printed circuit board shown in FIG. 8A. FIG. 9A is a side view showing a printed circuit board having an embedded chip capacitor in accordance with a third embodiment of the present invention, FIG. 9B illustrates the type of an etched pattern when the printed circuit board shown in FIG. 9A is viewed from a lower side and FIG. 9C is a schematic view showing an equivalent circuit of the printed circuit board shown in FIG. 9A.

Referring to FIG. 8A, in the case of a printed circuit board having an embedded chip capacitor in accordance with a second embodiment of the present invention, it can be recognized that a surrounding area of a part corresponding to the position of the chip capacitor 340 in the second conductive layer 320 is partially being etched to have a pattern in the printed circuit board in accordance with the first embodiment of FIG. 6, which was described above. Referring to FIG. 9A, in the case of a printed circuit board having an embedded chip capacitor in accordance with a third embodiment of the present invention, it can be also recognized that an etched pattern 370 is being formed in a surrounding area of a part corresponding to the position of the via 350 in the first conductive layer 310 in the printed circuit board in accordance with the first embodiment of FIG. 6.

Figure 9B:
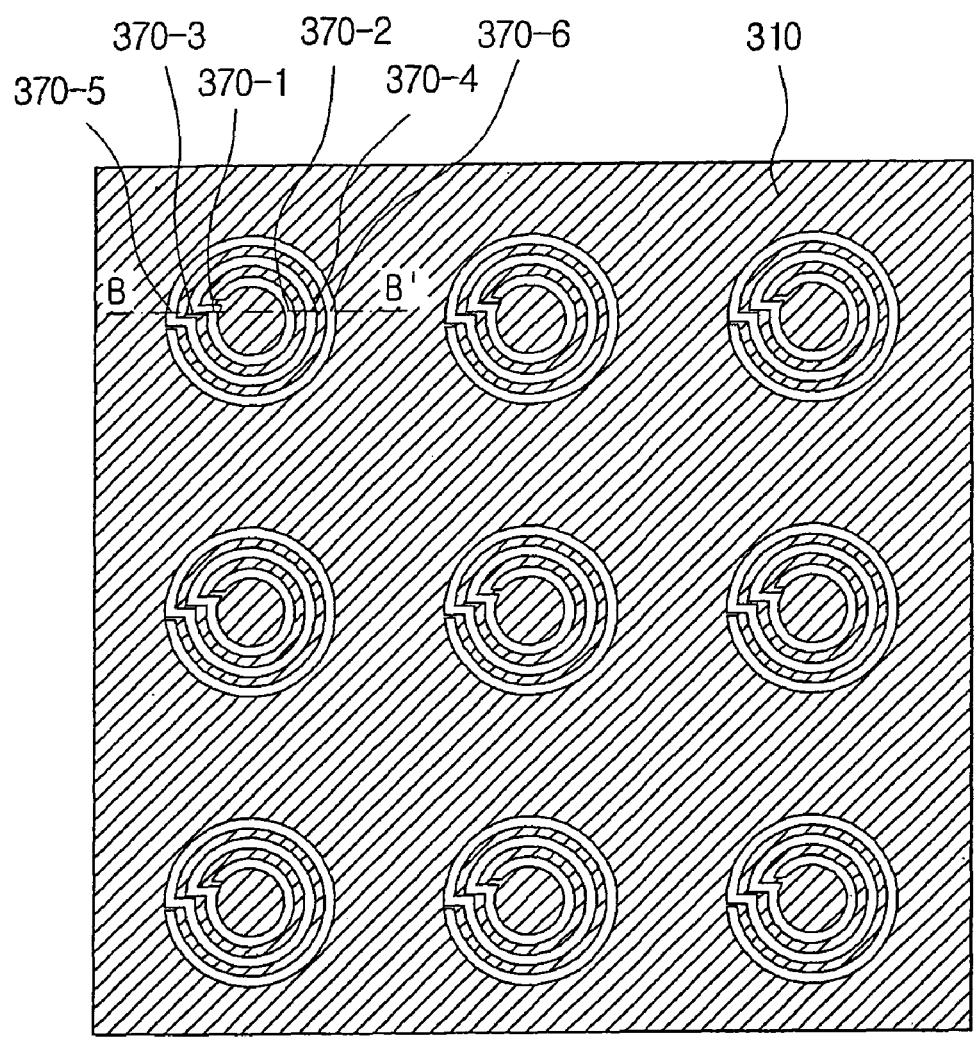
FIG. 9B illustrates the type of an etched pattern when the printed circuit board shown in FIG. 9A is viewed from a lower side.
Figure 9C:
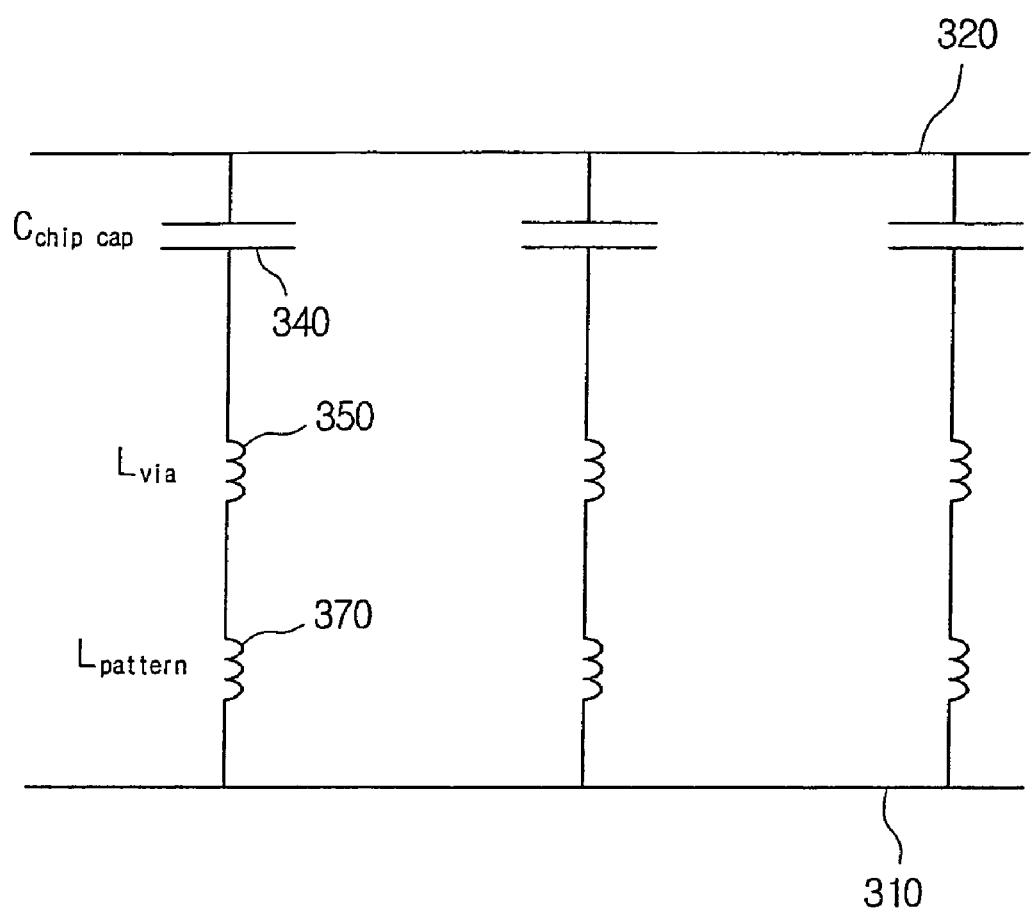
FIG. 9C is a schematic view showing an equivalent circuit of the printed circuit board shown in FIG. 9A.

Here, the etched pattern 370 can be formed in a spiral type as shown in FIG. 8b and FIG. 9B. As such, the etched pattern 370 formed in the spiral type can have some benefits as follows. The spiral type is the pattern type which can be manufactured to have the maximum pattern length in a narrow area. At this time, the etched pattern 370 formed in the first conductive layer 310 or the second conductive layer 320 can function as the inductance component in the printed circuit board.

Accordingly, the spiral type as the etched pattern 370 can realize the inductance having the largest value in the narrow area or surface. In addition, the spiral type, which includes the self inductance, formed in a lengthwise direction, and the mutual inductance, formed by intersection between spiral type etched patterns (e.g. 370-1 and 370-3 or 370-2 and 370-4 in FIG. 9A and FIG. 9B in FIG. 8A), can easily realize a larger inductance value.

Accordingly, the printed circuit board in accordance with the second or third embodiment of the presented invention can more efficiently and universally use the function as the electromagnetic bandgap structure intercepting the transfer of an electromagnetic wave having a desired frequency band by the etched pattern 370, which is additionally connected to the chip capacitor 340 in series, together with the inductance component by the via 350 (refer to FIG. 8C and FIG. 9C). This is because adjusting the inductance value according to the design modification of the diameter, length and shape of the via 350 between any two conductive layers of the printed circuit board having the determined size, thickness and area size can not but be partially restricted.

As compared with this, to obtain a desired inductance value by designing and controlling the shape, length, width and area size of the etched pattern 370 can be more easily performed on the design. This can increase the usability as the electromagnetic bandgap structure of the present invention.

Although FIG. 8A through FIG. 9C illustrate the etched pattern 370 of the spiral type, the etched pattern 370 can be designed and manufactured in various types (e.g. a trace type and a bar type). However, the etched pattern 370 can have an open-curved shape. This is because if the etched pattern 370 has a closed-curved shape, the electrical connection between the first conductive layer 310 and the first electrode 341 of the chip capacitor 340 or between the second conductive layer 320 and the second electrode 342 is broken, which results in allowing the chip capacitor 340 to be unable to function as the capacitor. Accordingly, any etched pattern 370 having an open-curved shape capable of electrically connecting the chip capacitor 340 to each conductive layer can be applied to the present invention without restriction.

Figure 10A:
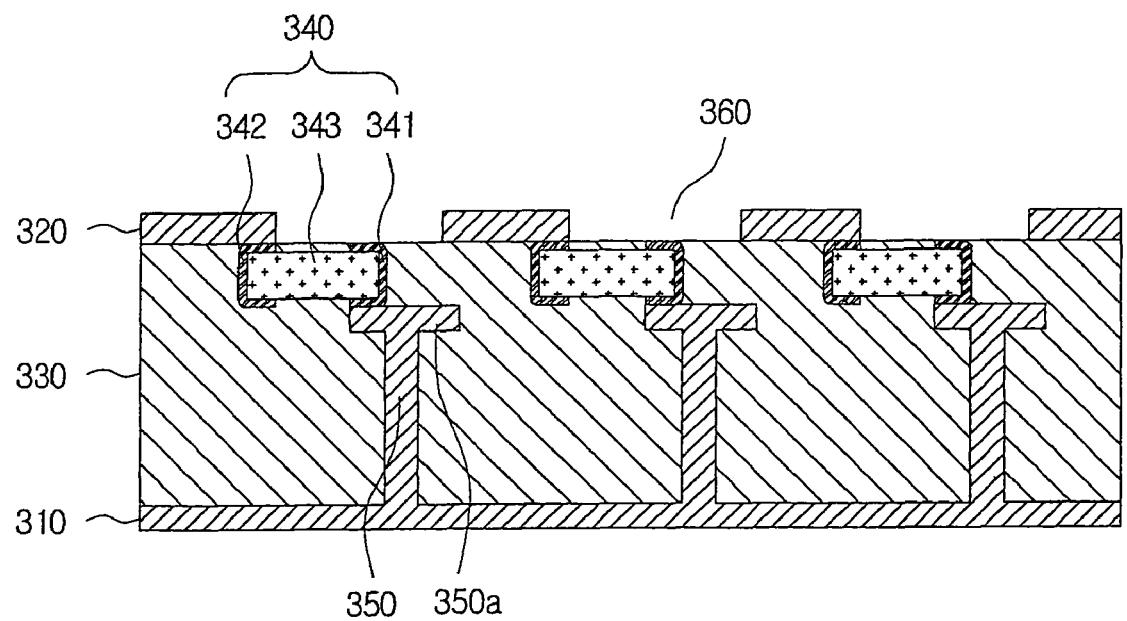
FIG. 10A is a side view showing a printed circuit board having an embedded chip capacitor in accordance with a fourth embodiment of the present invention.
Figure 10B:
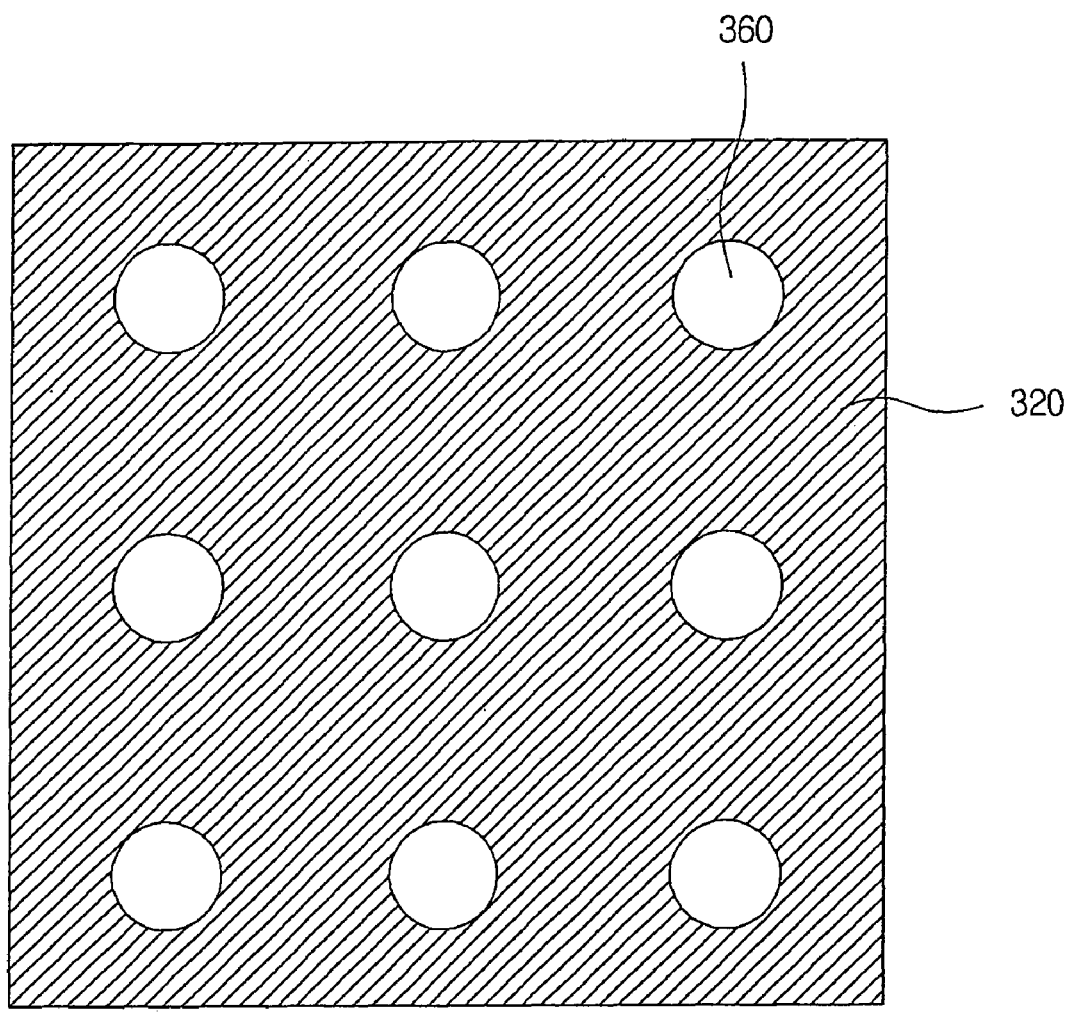
FIG. 10B illustrates a clearance hole when the printed circuit board shown in FIG. 10A is viewed from an upper side.

FIG. 10A is a side view showing a printed circuit board having an embedded chip capacitor in accordance with a fourth embodiment of the present invention, and FIG. 10B illustrates a clearance hole when the printed circuit board shown in FIG. 10A is viewed from an upper side.

Referring to FIG. 10A and FIG. 10B, a printed circuit board having an embedded chip capacitor in accordance with a fourth embodiment of the present invention can have the shape in which a clearance hole 360 is formed in a part of the second conductive layer 320.

The reason that the clearance hole 360 is formed at the second conductive layer 320 in the printed circuit board in accordance with the fourth embodiment of the present invention is as follows. All chip capacitors embedded in the printed circuit board in accordance with the forgoing embodiments are the flake type. The flake type indicates that the electrodes are formed in an upper side and a lower side, respectively, and the dielectric member is placed between the electrodes. In the chip capacitor of the flake type, since the two electrodes are in no surface-contact with each other on the same conductive layer because the two electrodes are arranged in the upper side and the lower side, respectively, as shown in FIG. 10A, it is unnecessary that the clearance hole 360 is formed in any conductive layer.

However, the fourth embodiment of the present invention uses a chip capacitor of an end-banded type. The end-banded type indicates that the electrodes are formed in a lower side and a right side, respectively, and the dielectric member is placed between the electrodes. In the chip capacitor of the end-banded type, since the two electrodes may be in surface-contact with each other on the same conductive layer because the two electrodes are arranged in the left side and the right side, respectively, of a plane. Accordingly, in the case of FIG. 10A, the clearance hole 360 can be formed in a part of corresponding to the position of the first electrode 341 in the second conductive layer 320, in order to allow the first electrode 341 and the second electrode 342 of the chip capacitor 340 to be electrically disconnected to the second conductive layer 320.

Of course, the printed circuit board in accordance with the foresaid fourth embodiment of the present invention can function as the electromagnetic bandgap structure by the same principle (i.e. the series connection structure between the chip capacitor 340 and the via 350) as described with reference to FIG. 6.

Figure 11A:
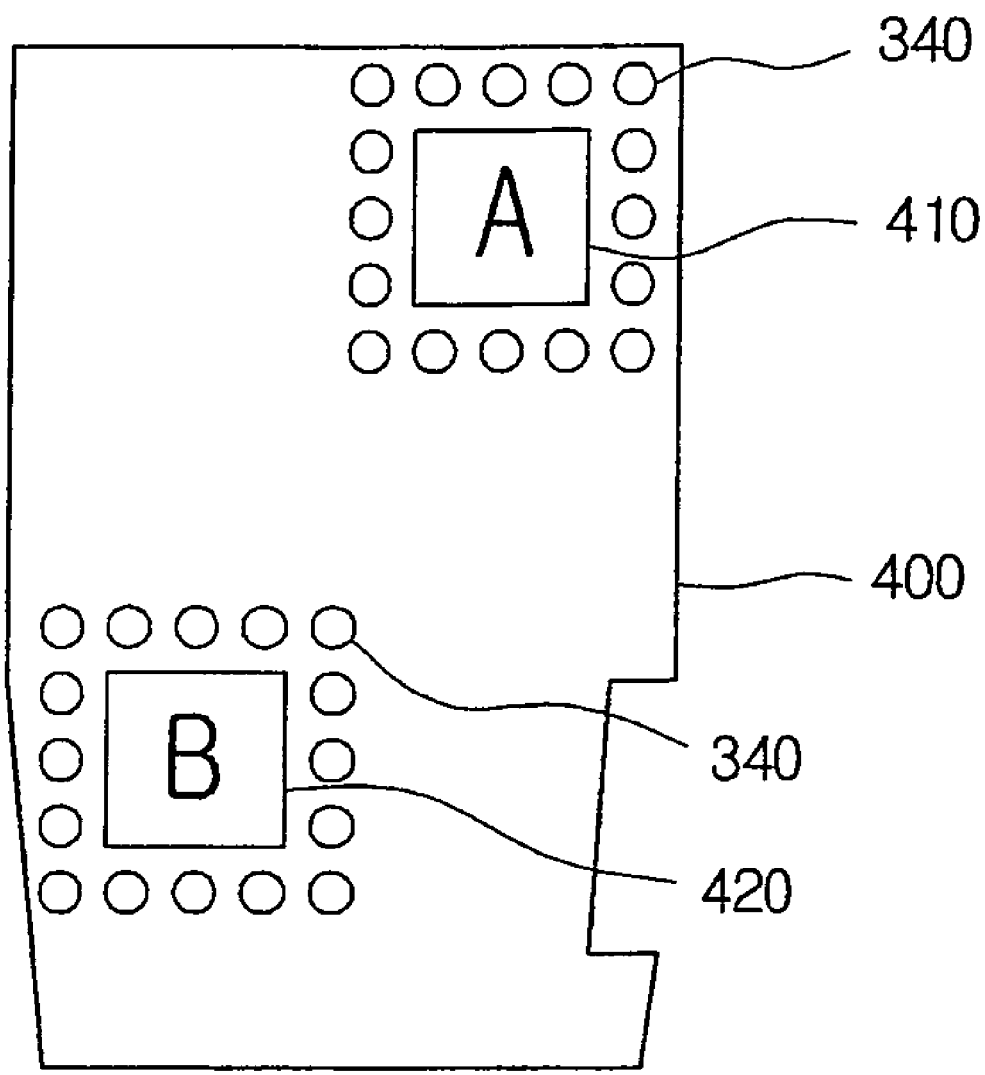
FIG. 11A through FIG. 11C are examples illustrating a printed circuit board in which a chip capacitor is arranged in a band structure in accordance with the present invention.
Figure 11B:
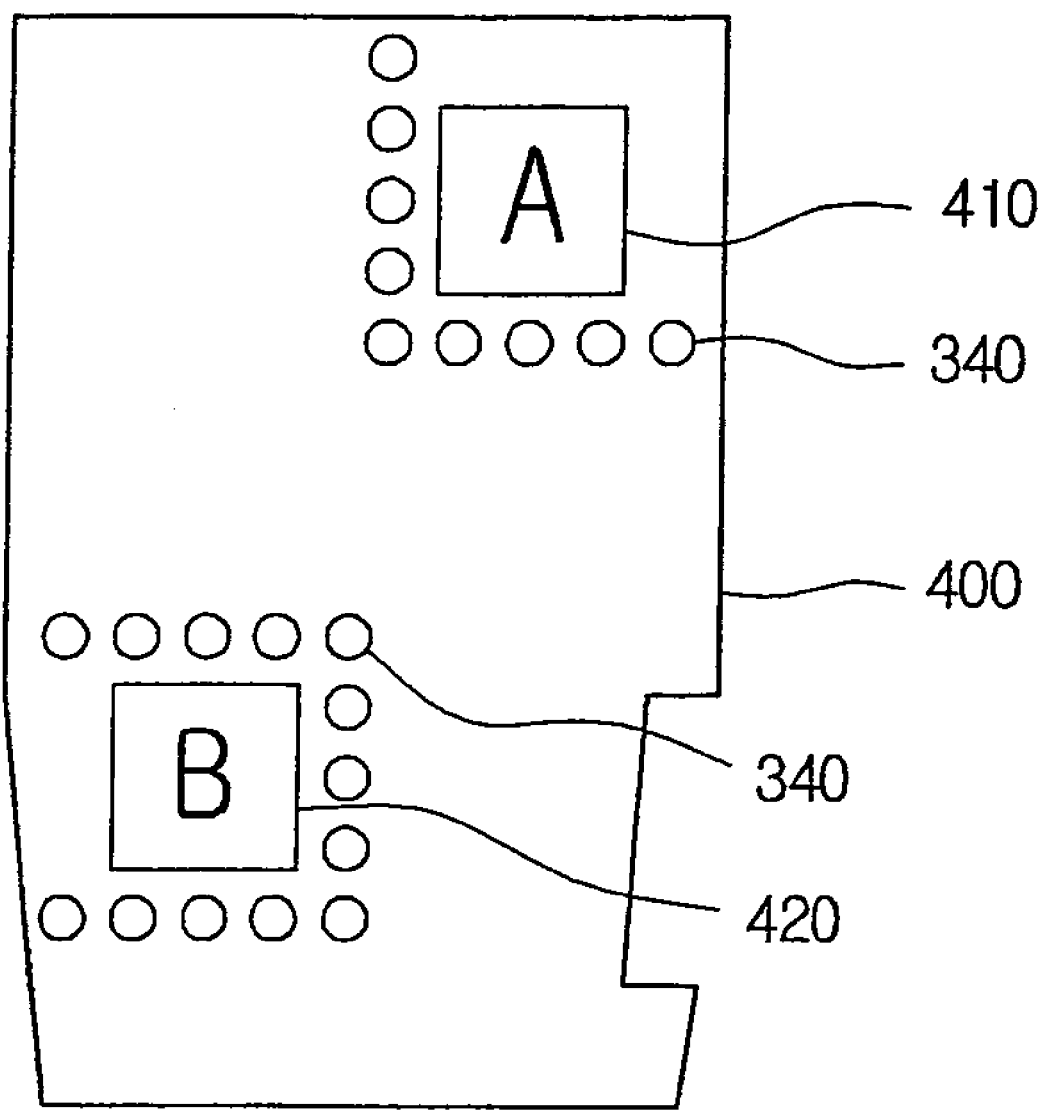
Figure 11C:
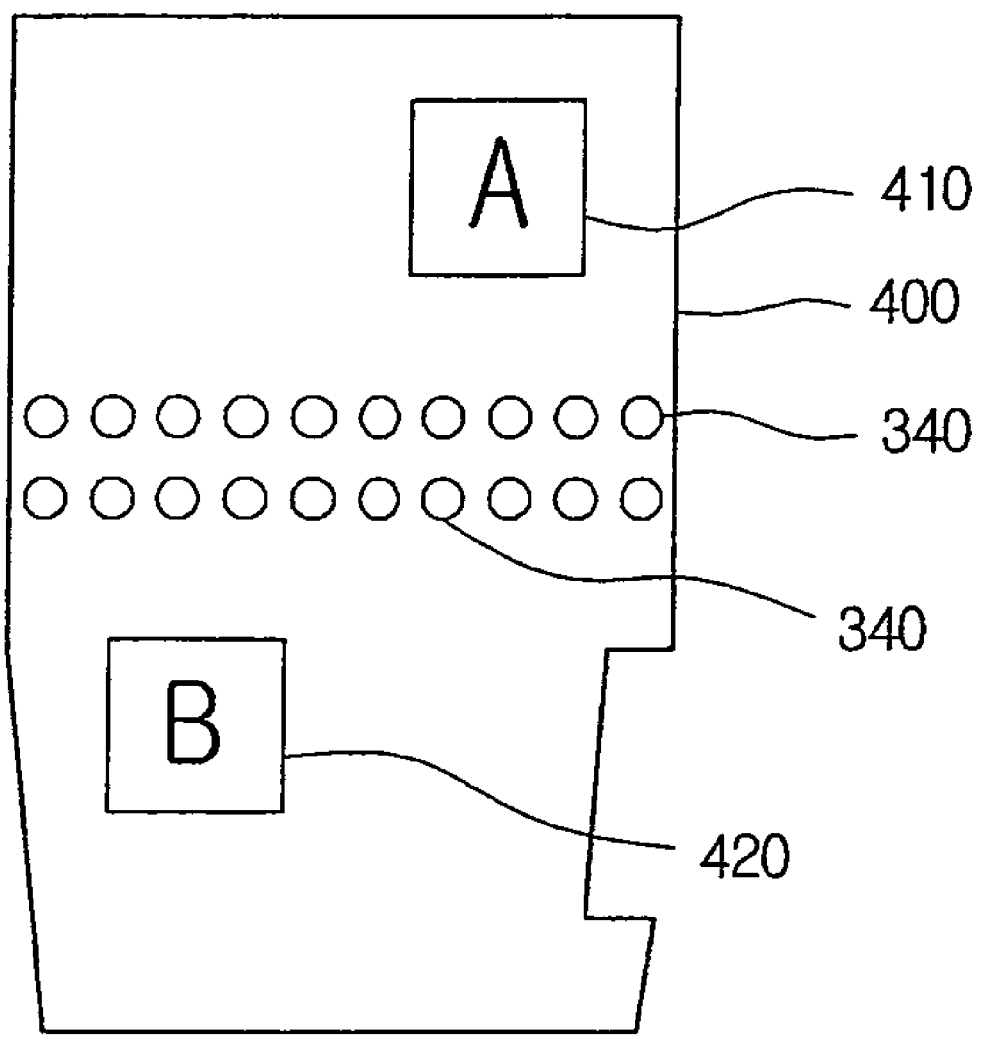

FIG. 11A through FIG. 11C are examples illustrating a printed circuit board in which a chip capacitor is arranged in a band structure in accordance with the present invention. Based on the view from an upper side of the printed circuit board, each part corresponding to the position embedded with the series connection structure between the chip capacitor 340 and the via 350 is represented as circles (actually, when viewed from an upper side, the chip capacitor 340 only is illustrated) for the convenience of illustration.

In FIG. 11A through FIG. 11C, a region A 410 and a region B indicates two regions necessary to prevent mutual interference, respectively, due to using different frequency bands. The below description assumes that the region A 410 is mounted with the RF circuit and the region B 420 is mounted with the digital circuit in the case of a mobile phone main board 400. In other words, if any one of the region A 410 and the region B 420 functions as a noise source in their mutual relationship, the other is determined as a noise prevented destination.

Through FIG. 11A through FIG. 11C, it can be recognized that a plurality of series connection structures between the chip capacitor 340 and the via 350 (or between the chip capacitor 340, the via 350 and the etched pattern 370) are arranged in a path between the noise source and the noise prevented destination, placed in the printed circuit board. In other words, the present invention can use the method having and embedding the plurality of series connection structures between the chip capacitor 340 and the via 350 on the pertinent noise-transferable path in order to prevent a mixed signal or noise having a frequency band, which is possible to be generated from an electrical element placed at the noise source and to have an affect on the other electrical element placed at the noise prevented destination.

In particular, FIG. 11A shows a band structure in which the plurality of series connection structures between the chip capacitor 340 and the via 350 are arranged to envelop the four sides of a region A 410 and a region B 420, respectively, in a closed loop shape. Of course, unlike FIG. 11A, it is possible to envelop either the noise source or the noise prevented destination.

FIG. 11B shows the plurality of series connection structures between the chip capacitor 340 and the via 350 envelops the two or three sides of the region A 410 and the region B 420, respectively, in a rectangular shape with one side open or an 'L' shape instead of enveloping the four sides as shown in FIG. 11A. As such, it is possible to envelop each region in the shape of the board with one side open. Accordingly, it is obvious that the band structure can have the shape having the rotational displacement of the rectangular shape with one side open or an 'L' shape according to the shape of the board and the position of the closed region.

Unlike FIG. 11A and FIG. 11B, the FIG. C shows that the plurality of series connection structures between the chip capacitor 340 and the via 350 are arranged in straight-line shapes having at least one line to separate the region A 410 and the region B 420 by crossing the area between the two regions, instead of enveloping each prevented region.

In addition to FIG. 11A through FIG. 11C, it is understandable to any person of ordinary skill in the art that the cavity capacitors can be arranged in the noise-transferable path between the noise source and the noise prevented destination in various ways.

For example, it is unnecessary that the size, shape, area size and length, respectively, of the plurality of series connection structures between the chip capacitor 340 and the via 350 are the same. At least one of the size, shape, area size and length of the plurality of series connection structures between the chip capacitor 340 and the via 350 can be differently can be determined. Since these factors are closely related to a frequency band desired to be prevented, the factors can be optimally selected according to the prevented desired frequency band or the design specifications.

In other words, if it is necessary to more broadly set the frequency band of the noise desired to be prevented, it can be preferable to alternately or repeatedly arrange the plurality of series connection structures between the chip capacitor 340 and the via 350 having various size, shape, area size and length according to the necessary frequency band. Reversely, if it is necessary to more narrowly set and more accurately prevent the frequency band of the noise desired to be prevented, it can be preferable to arrange series connection structures between the chip capacitor 340 and the via 350 having the same size and shape at shorter intervals or repeatedly in a plurality of lines according to the necessary frequency band.

Figure 12A:
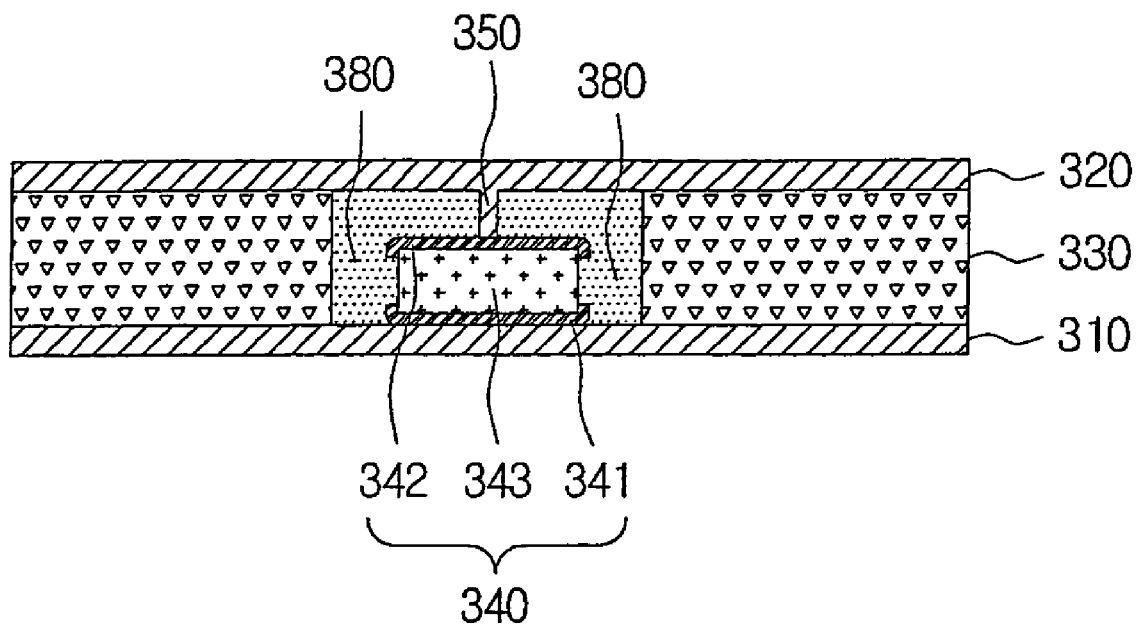
FIG. 12A is a side view showing a printed circuit board having an embedded chip capacitor in accordance with a fifth embodiment of the present invention.
Figure 12C:
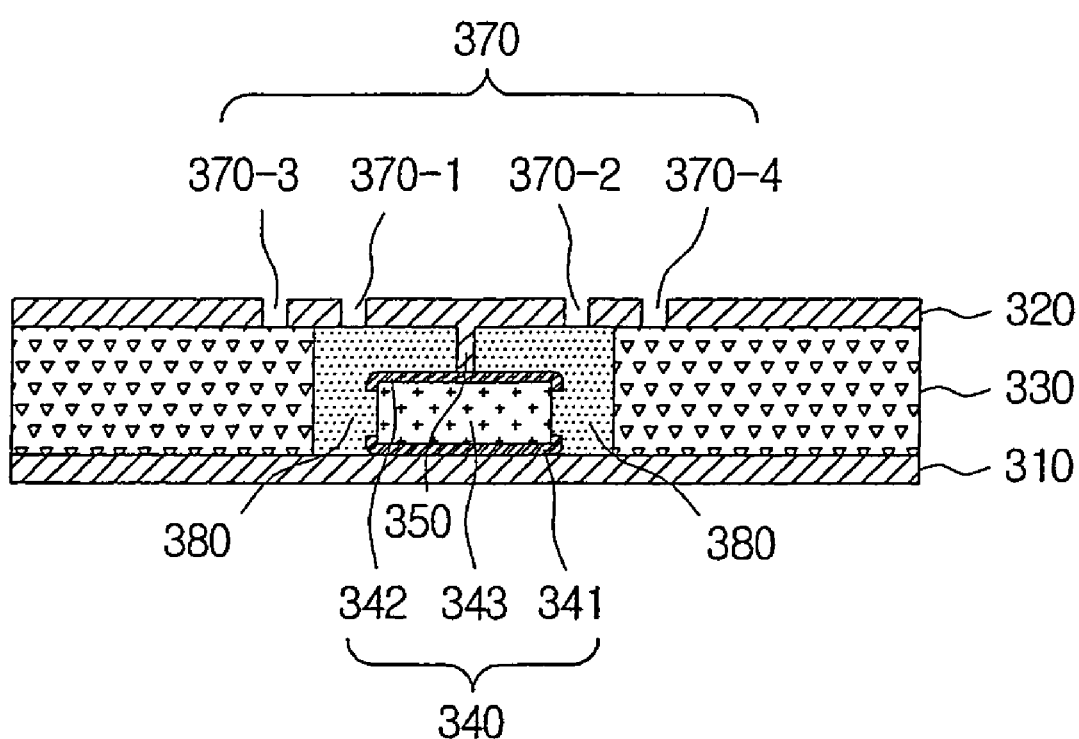
FIG. 12C is a side view showing a printed circuit board having an embedded chip capacitor in accordance with a seventh embodiment of the present invention.

FIG. 12A is a side view showing a printed circuit board having an embedded chip capacitor in accordance with a fifth embodiment of the present invention, FIG. 12B is a side view showing a printed circuit board having an embedded chip capacitor in accordance with a sixth embodiment of the present invention and FIG. 12C is a side view showing a printed circuit board having an embedded chip capacitor in accordance with a seventh embodiment of the present invention.

Referring to FIG. 12A, in a printed circuit board having an embedded chip capacitor in accordance with a fifth embodiment of the present invention, the chip capacitor 340 can be seated in a cavity (refer to 380a of FIG. 13C to be described below) which is formed by removing a part of the dielectric layer 330 placed between the first conductive layer 310 and the second conductive layer 320. Seating the chip capacitor 340 in the cavity allows the first electrode 341 to be connected to the first conductive layer 310. At this time, a filled material 380 can be filled in a space excluding the space occupied by the chip capacitor 340 in the cavity formed between the first conductive layer 310 and the second conductive layer 320, and the via 350 can penetrate the filled material 380 to electrically connect the second electrode 342 of the chip capacitor 340 to the second conductive layer 320.

Referring to FIG. 12B and FIG. 12C, in the case of a sixth embodiment and a seventh embodiment of the present invention, it can be recognized that the similar etched pattern to that of FIG. 8A and FIG. 9A is being formed in a surrounding area of a part corresponding to the position of the via 350 or a surrounding area of a part corresponding to the position of the chip capacitor 340 at the first conductive layer 310 or the second conductive layer 320 in the printed circuit board in the printed circuit board in accordance with the fifth embodiment of FIG. 12A.

Similarly, the printed circuit board shown in FIG. 12A through FIG. 12C can function as the electromagnetic bandgap structure by penetrating the chip capacitor 340 and the filled material 380 placed in the cavity formed the board and forming the LC series connection structure by the via 350 connected in series to the chip capacitor 340 (or the etched pattern 370 additionally connected in series to the via 350).

Also, the printed circuit board shown in FIG. 12A can have a simpler fabrication process of the series connection structure between the chip capacitor 340 and the via 350 than the printed circuit board shown in FIG. 6 through FIG. 10B. This will be described with reference to FIG. 13A through FIG. 13F.

FIG. 13A through 13F illustrate the method for embedding a chip capacitor in the case of the printed circuit board shown in FIG. 12A.

Figure 13A:
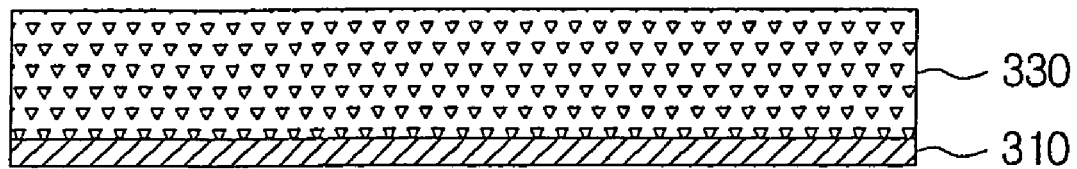
FIG. 13A through 13F illustrate the method for embedding a chip capacitor in the case of the printed circuit board shown in FIG. 12A.

Referring to FIG. 13A, the printed circuit board including the first conductive layer 310 and the first conductive layer 330 stacked in an upper part is illustrated.

Figure 13B:
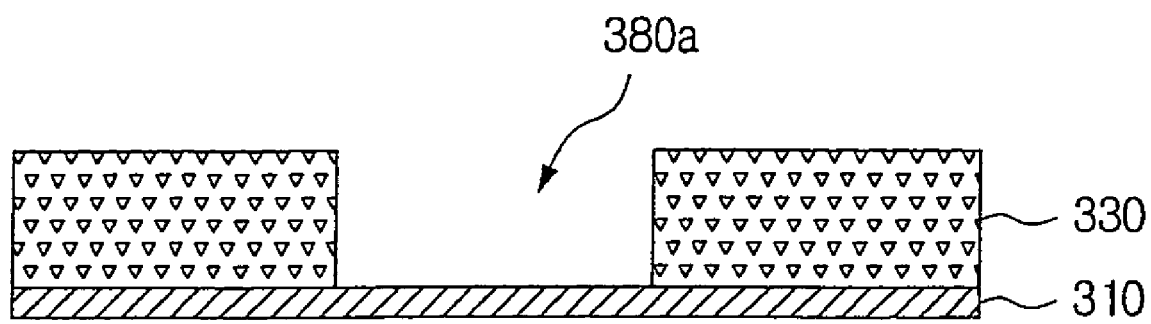
Figure 13C:
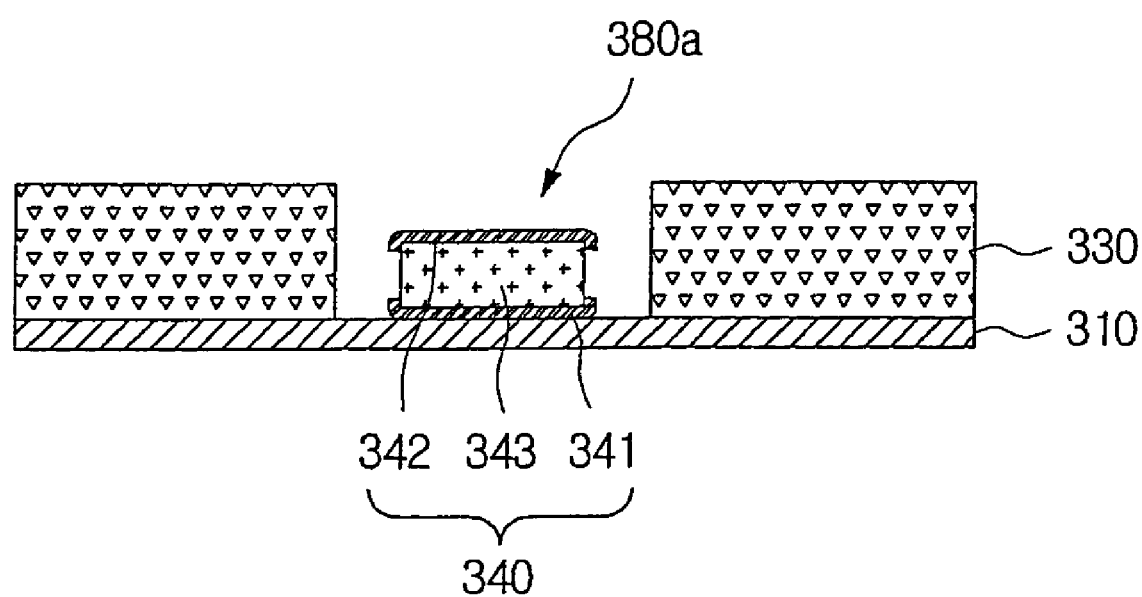

Referring to FIG. 13B, the dielectric layer 330 can be removed so as to allow the cavity 380a to be placed at a particular point of the dielectric layer 330 stacked in on the first conductive layer 310.

The formation operations of cavity 380a through the process are for seating the chip capacitor 340 in the cavity 380 (refer to FIG. 13C) and for electrically connecting the first electrode 341 of the chip capacitor 340 and the first conductive layer 310. Accordingly, the size, area size and height of the cavity 380a formed through the process can be determined considering the size, area size and height of the chip capacitor 340 to be embedded, and the dielectric layer 330 can be removed to expose the first electrode 310 through the formation operations of the cavity 380a.

Figure 13D:
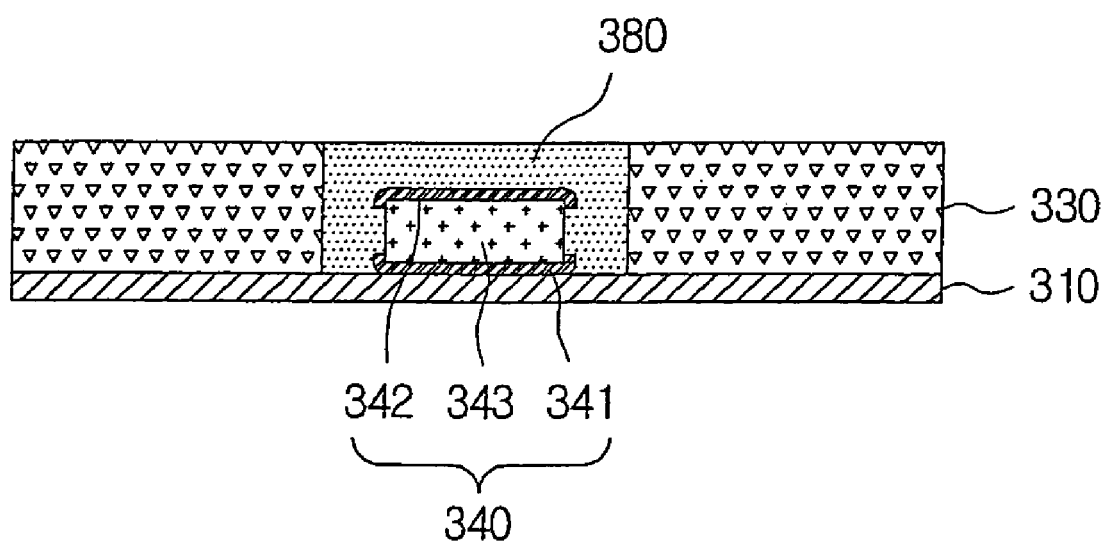

Referring to FIG. 13D, the filled material 380 can be filled in a space excluding the space occupied by the chip capacitor 340 in the cavity 380a. At this time, the filled material 380 can employ an insulation material to connect the first conductive layer 310 to be electrically disconnected to the second conductive layer 320 or the first electrode 341 to be electrically disconnected to the second electrode 342.

Figure 13E:
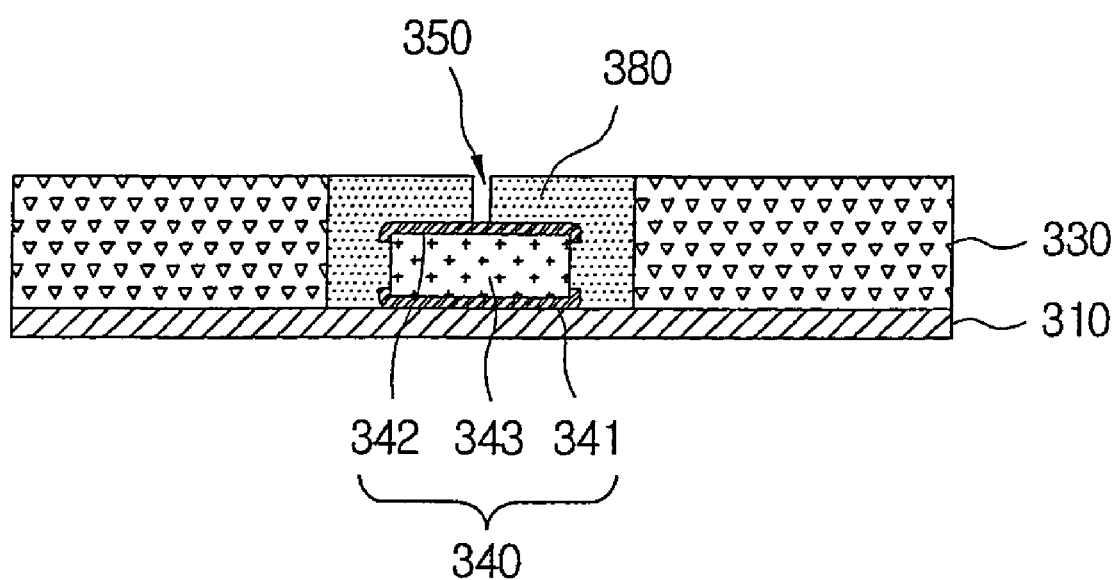

Referring to FIG. 13E, the via 350 penetrating the filled material 380 and being connected to the second electrode 342 of the chip capacitor 340 can formed. For example, the via 350 can be formed through a drilling process using a laser drill.

Figure 13F:
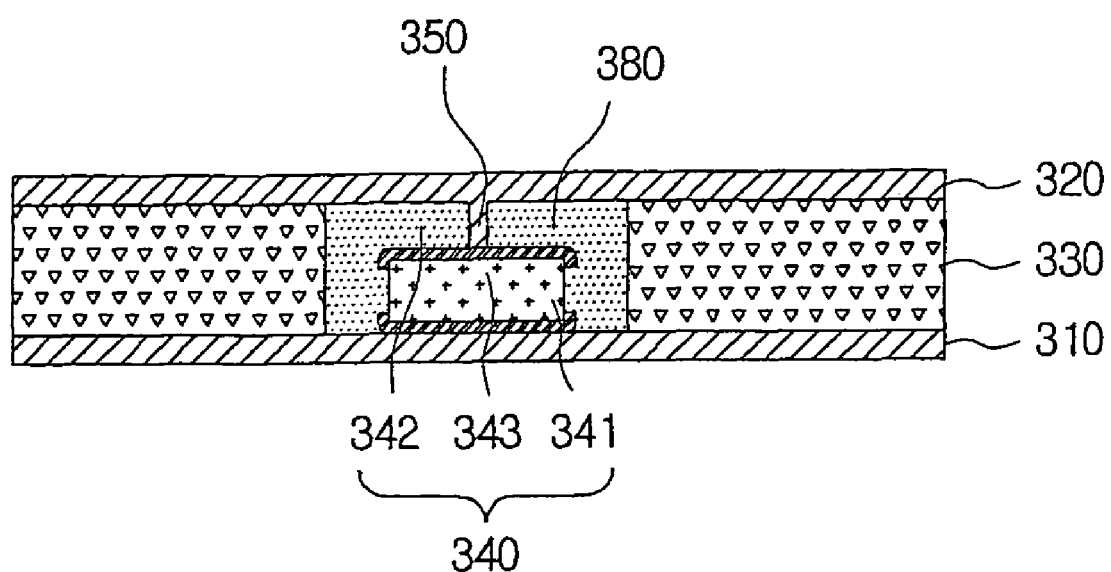

Referring to FIG. 13F, a conductive material can be stacked in so as to allow the second electrode 242 of the chip capacitor 340 to be electrically connected to the second conductive layer 320 through the via 350. The stacking process of the conductive material can be performed in various ways.

For example, if the stacking process by the same conductive material is performed, the conductive material can be charged or applied to an inside of the via 350 together with the formation of the second conductive layer 320. Also, after firstly charging or applying the conductive material (e.g. a conductive paste, the same material as the second conductive layer 320 to be formed later, and the filled material) to the inside of the via 350, the conductive material (e.g. cupper) to form the second conductive layer 320 can be stacked on the surfaces of the via 350, the dielectric layer 330 and the filled material 380. At this time, the via 350 can be filled with the conductive material in the inside or the conductive material can be applied to inner walls excluding a center area. Here, if the via 350 has the empty center area, an additional dielectric material or air can be filled in the empty center area.

Although the above description is related to the method of embedding the chip capacitor 340 in the printed circuit board shown in FIG. 12A, in the case of the printed circuit board shown in FIG. 12B or FIG. 12C, the formation process of the etched pattern 370 can be added. For example, in the case of FIG. 12B, the step of forming the etched pattern 370 having an open curved shape of spiral type in a surrounding area corresponding to the position to be formed with the cavity 380a in the first conductive layer 380 can be added. Also, in the case of FIG. 12C, the step of forming the etched pattern 370 in a surrounding area of a part corresponding to the position to be formed with the via 350 in the second conductive 320 will be able to be added.

Figure 14A:
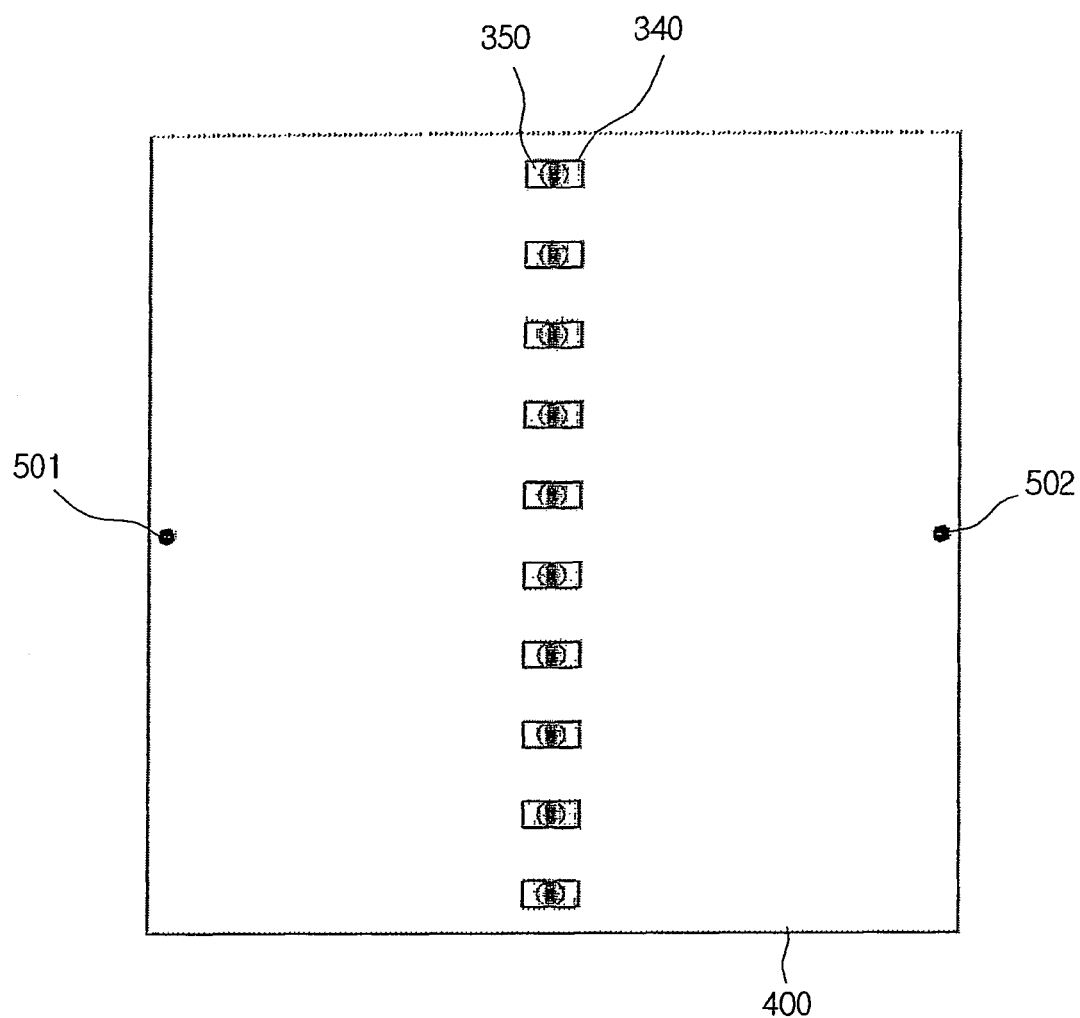
FIG. 14A illustrates a simulation model for checking whether the series connection structure between a via and a chip capacitor embedded in a printed circuit board can be used as an electromagnetic bandgap in accordance with the present invention.
Figure 14B:
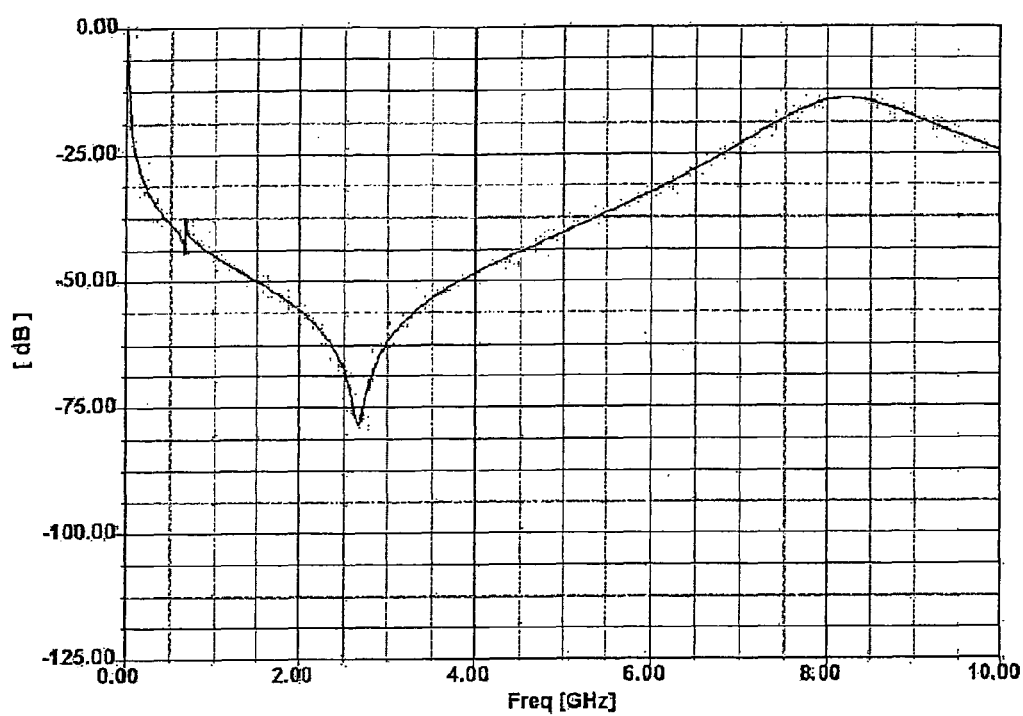
FIG. 14B shows a computer-simulation result when the simulation model shown in FIG. 14A is applied.

FIG. 14A illustrates a simulation model for checking whether the series connection structure between a via and a chip capacitor embedded in a printed circuit board can be used as an electromagnetic bandgap in accordance with the present invention, and FIG. 14B shows a computer-simulation result when the simulation model shown in FIG. 14A is applied.

The simulation model of FIG. 14A shows the one-band structure in which the printed circuit board 400 includes a noise point 501 and a measurement point 502, and the series connection structure between the chip capacitor 340 and the via 350 is arranged between the noise point 501 and the measurement point 502. The graph of FIG. 14B is the computer simulation result showing how much noise supplied to the noise point 501 does reach the measurement point 502.

Referring to FIG. 14B, in the case of the simulation model of FIG. 14A, it can be recognized that the bandgap frequency has an appropriately 1.5~3.8 GHz band on a basis of a (−) 50 db shield rate. Though this simulation result, it can be recognized again that the printed circuit board having the series connection structure between the chip capacitor 340 and the via 350, embedded in the printed circuit board, in accordance to the present invention can function as a band reject filter by the structural property.

Although the simulation result of FIG. 14B shows the bandgap frequency has the appropriately 1.5~3.8 GHz band, the bandgap frequency can be changed according to the diameter, length, and shape of the via 350, the change of an inductance value depending on the shape, length, area size and width of the etched pattern 370, the thickness and area size of the dielectric member 343 of the chip capacitor and the type and dielectric constant of the dielectric material forming the dielectric member 343.

Accordingly, the present invention can prevent the electromagnetic wave having the desired frequency band by using the series connection structure between the chip capacitor and the via 350 embedded in the printed circuit board as the electromagnetic bandgap structure. Also, the present invention can have simpler structure than the conventional art (e.g. the mushroom by the metal plate and the via). This can result in no design limitation and the difficulty of the configuration and the outstanding property in the aspect of signal integrity.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. A printed circuit board having an embedded chip capacitor, the printed circuit board comprising:
   a first conductive layer;
   a second conductive layer, placed away from the first conductive layer;
   a chip capacitor, having a first electrode directly connected to any one of the first conductive layer and the second conductive layer through being seated in a cavity formed between the first conductive layer and the second conductive layer, and a second electrode electrically connected to the other of the first conductive layer and the second conductive layer through a via;
   a filled material, filled in a space excluding a space occupied by the chip capacitor in the cavity; and
   a via, penetrating the filled material and connecting the second conductive layer to the second electrode of the chip capacitor,
   wherein a plurality of series connection structures between the chip capacitor and the via are arranged in a noise transferable path between a noise source and a noise prevented destination, and
   wherein the printed circuit board is mounted with a digital circuit and an analog circuit, and the noise source and the noise prevented destination correspond to one and the other, respectively, of positions in which the digital circuit and the analog circuit are supposed to be mounted in the printed circuit board.

2. The printed circuit board of claim 1, wherein any one of the first conductive layer and the second conductive layer is a power layer, and the other layer is a ground part.

3. The printed circuit board of claim 1, wherein an etched pattern is formed in an open-curved line shape in a surrounding area of a part corresponding to a position of the via or the chip capacitor in the first conductive layer or the second conductive layer.

4. The printed circuit board of claim 3, wherein the etched pattern has a spiral shape.

5. The printed circuit board of claim 1, wherein the chip capacitor is coupled to an inductance component by the via, connected to the chip capacitor in series, to intercept the transfer of an electromagnetic wave having a desired frequency band.

6. The printed circuit board of claim 1, wherein the series connection structure between the chip capacitor and the via is arranged in a band structure in the noise transferable path.

7. The printed circuit board of claim 6, wherein the band structure has a shape enveloping at least one of the noise source and the noise prevented destination.

8. The printed circuit board of claim 7, wherein the band structure has any one of a closed loop shape, a rectangular shape with one side open, and an 'L' shape.

9. The printed circuit board of claim 7, wherein the band structure has a straight-line shape of at least one line to separate the noise source and the noise prevented destination by crossing the area between the noise source and the noise prevented destination.

* * * * *